United States Patent
Tanemura et al.

(10) Patent No.: US 9,537,014 B2
(45) Date of Patent: Jan. 3, 2017

(54) SEMICONDUCTOR DEVICE, METHOD FOR MANUFACTURING SEMICONDUCTOR DEVICE, AND ELECTRONIC DEVICE

(71) Applicant: Semiconductor Energy Laboratory Co., Ltd., Atsugi-shi, Kanagawa-ken (JP)

(72) Inventors: Kazuki Tanemura, Kanagawa (JP); Tetsuhiro Tanaka, Kanagawa (JP); Kosei Noda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/723,624

(22) Filed: May 28, 2015

(65) Prior Publication Data
US 2015/0349130 A1 Dec. 3, 2015

(30) Foreign Application Priority Data

May 29, 2014 (JP) .................. 2014-111390

(51) Int. Cl.
*H01L 29/12* (2006.01)
*H01L 29/786* (2006.01)
(Continued)

(52) U.S. Cl.
CPC ........... *H01L 29/7869* (2013.01); *H01L 22/20* (2013.01); *H01L 27/1225* (2013.01);
(Continued)

(58) Field of Classification Search
None
See application file for complete search history.

(56) References Cited

U.S. PATENT DOCUMENTS 5,731,856 A  3/1998 Kim et al.
5,744,864 A  4/1998 Cillessen et al.
(Continued)

FOREIGN PATENT DOCUMENTS

EP  1737044 A  12/2006
EP  2226847 A  9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Fei Fei Yeung Lopez
(74) *Attorney, Agent, or Firm* — Fish & Richardson P.C.

(57) ABSTRACT

Threshold voltage adjustment method of a semiconductor device is provided. In a semiconductor device in which at least one of transistors included in an inverter includes a semiconductor, a source electrode or a drain electrode electrically connected to the semiconductor, a gate electrode, and a charge trap layer provided between the gate electrode and the semiconductor, the potential of the gate electrode of the transistor that is higher than those of the source electrode and the drain electrode is held for a short time of 5 s or shorter, whereby electrons are trapped in the charge trap layer and the threshold voltage is increased. At this time, when the potential differences between the gate electrode and the source electrode, and the gate electrode and the drain electrode are different from each other, the threshold voltage of the transistor of the semiconductor device becomes appropriate.

19 Claims, 26 Drawing Sheets

(51) Int. Cl.
  *H01L 27/12* (2006.01)
  *H01L 29/51* (2006.01)
  *H01L 29/792* (2006.01)
  *H01L 27/088* (2006.01)
  *H01L 27/11* (2006.01)
  *H01L 27/115* (2006.01)
  *H01L 21/66* (2006.01)

(52) U.S. Cl.
  CPC ........ *H01L 27/1259* (2013.01); *H01L 29/513*
    (2013.01); *H01L 29/517* (2013.01); *H01L*
    *29/78696* (2013.01); *H01L 29/792* (2013.01);
    *H01L 22/14* (2013.01); *H01L 27/0883*
    (2013.01); *H01L 27/1104* (2013.01); *H01L*
    *27/1156* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,952,392 B2 | 5/2011 | Koyama et al. |
| 8,067,775 B2 | 11/2011 | Miyairi et al. |
| 8,106,400 B2 | 1/2012 | Miyairi et al. |
| 8,188,477 B2 | 5/2012 | Miyairi et al. |
| 8,305,109 B2 | 11/2012 | Okazaki et al. |
| 8,319,215 B2 | 11/2012 | Yamazaki et al. |
| 8,344,372 B2 | 1/2013 | Yamazaki et al. |
| 8,384,080 B2 | 2/2013 | Taniguchi et al. |
| 8,518,739 B2 | 8/2013 | Miyairi et al. |
| 8,547,771 B2 | 10/2013 | Koyama |
| 8,692,252 B2 | 4/2014 | Takata et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0151426 A1* | 8/2003 | Islam ............... H03K 19/00323 326/37 |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278120 A1* | 11/2009 | Lee .................... H01L 29/4908 257/43 |
| 2009/0278122 A1 | 11/2009 | Hosono et al. |
| 2009/0280600 A1 | 11/2009 | Hosono et al. |
| 2010/0059744 A1* | 3/2010 | Yin .......... H01L 21/84 257/43 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0069047 A1 | 3/2011 | Koyama et al. |
| 2011/0121284 A1* | 5/2011 | Yamazaki ......... H01L 29/42392 257/43 |
| 2012/0056175 A1 | 3/2012 | Takemura |
| 2015/0008428 A1 | 1/2015 | Yamamoto et al. |
| 2015/0011046 A1 | 1/2015 | Tanaka et al. |
| 2015/0011048 A1 | 1/2015 | Tanaka et al. |
| 2015/0024577 A1 | 1/2015 | Kato et al. |
| 2015/0054548 A1 | 2/2015 | Kato et al. |
| 2015/0060846 A1 | 3/2015 | Yamamoto et al. |
| 2015/0069385 A1 | 3/2015 | Yamamoto et al. |
| 2015/0069387 A1 | 3/2015 | Yamamoto et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |

(56) References Cited

FOREIGN PATENT DOCUMENTS

| | | |
|---|---|---|
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2011-124360 A | 6/2011 |
| JP | 2011-138934 A | 7/2011 |
| JP | 2012-074692 A | 4/2012 |
| JP | 2012-257187 A | 12/2012 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YbFe2O4, and Yb2Fe3O7 Types of Structures for Compounds in the In2O3 and Sc2O3—A2O3—BO Systems [A; Fe. Ga, or Al; B: Mg, Mn, Fe, Ni, Cu, or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m = 3, 4, and 5), InGaO3)ZnO)3, and Ga2O3(ZnO)m (m= 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor," Science, May 23, 2003, vol. 300, No. 5623, pp. 1269-1272.

Ikeda.T et al., "Full-Functional System Liquid Crystal Display Using CG-Silicon Technology", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductor", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06: Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 : Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 15th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

(56) References Cited

OTHER PUBLICATIONS

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B. (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

\* cited by examiner

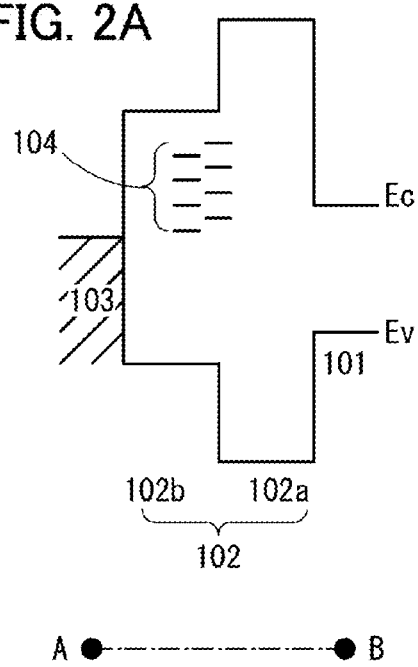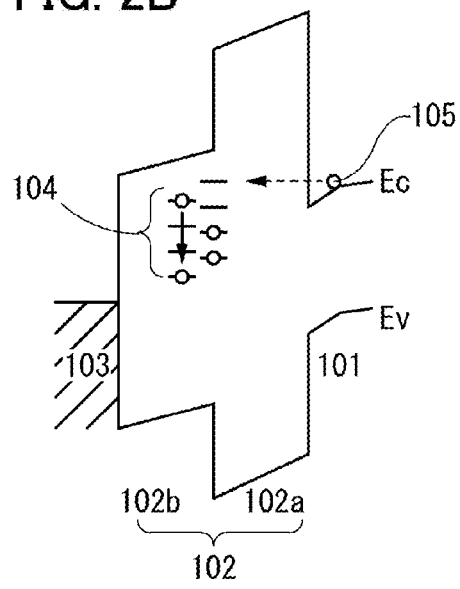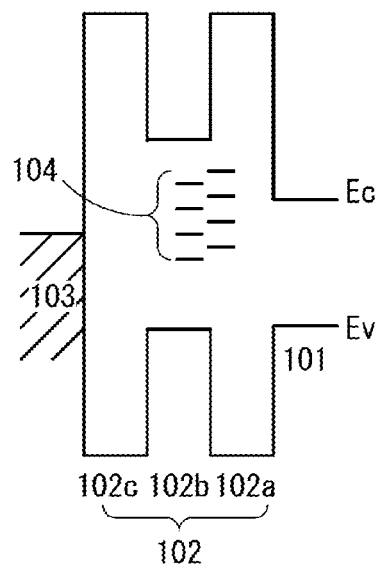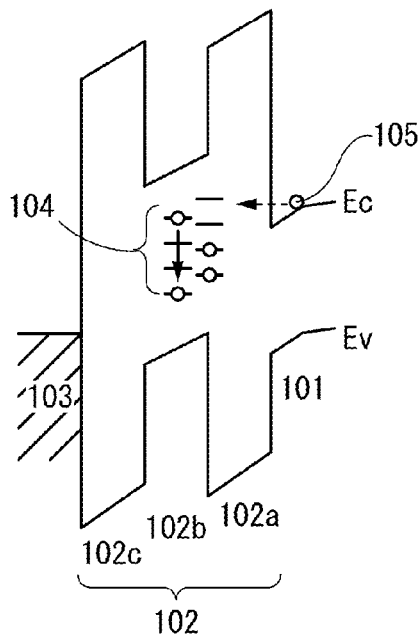

measuring initial characteristics injecting electrons measuring resin sealing・packaging GBT stress condition: Vd=Vs=0V, Vtg=3.3V,
   temperature=150°C, test time=1hr
DBT stress condition: Vd=+1.8V, Vs=0V, Vtg=0V,
   temperature=150°C, test time=1h
Id-Vg measurement condition: Vd=0.1V, Vs=0V,
   Vtg=-3.0V~+3.0V,
   Vtgstep=+0.1V, temperature=40°C FIG. 23A
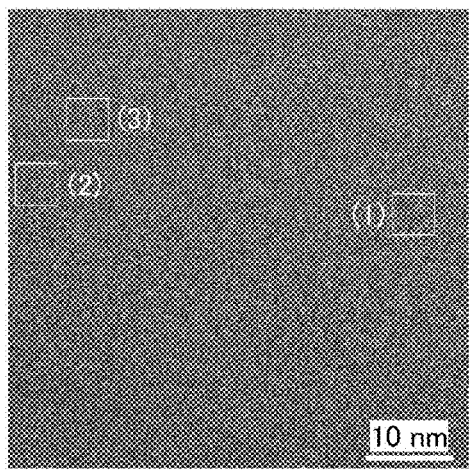
FIG. 23B          FIG. 23C          FIG. 23D
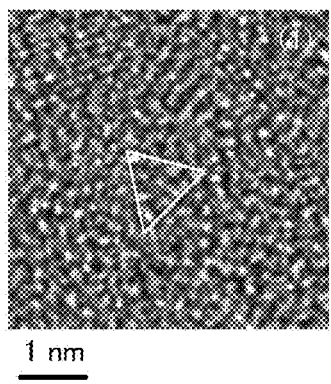 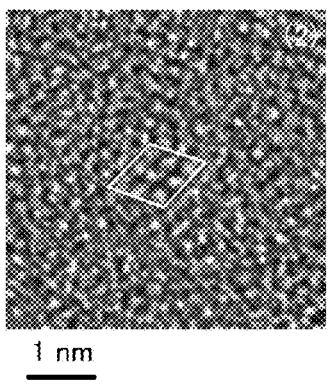 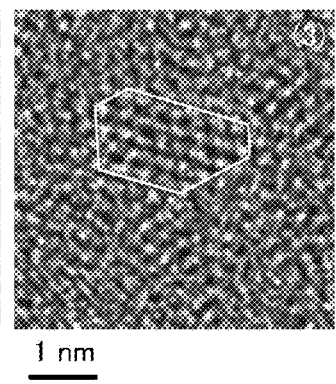

SEMICONDUCTOR DEVICE, METHOD FOR MANUFACTURING SEMICONDUCTOR DEVICE, AND ELECTRONIC DEVICE

BACKGROUND OF THE INVENTION

1. Field of the Invention

The present invention relates to, for example, a transistor, a semiconductor device, and a manufacturing method thereof. The present invention relates to, for example, a display device, a light-emitting device, a lighting device, a power storage device, a memory device, a processor, and an electronic device. The present invention relates to a method for manufacturing a display device, a liquid crystal display device, a light-emitting device, a memory device, and an electronic device. The present invention relates to a driving method of a semiconductor device, a display device, a liquid crystal display device, a light-emitting device, a memory device, and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A transistor and a semiconductor circuit are embodiments of semiconductor devices. In some cases, a storage device, a display device, or an electronic device includes a semiconductor device.

2. Description of the Related Art

A technique in which a transistor is formed using a semiconductor has attracted attention. The transistor is used in a wide range of electronic devices such as an integrated circuit (IC) or an image display device. As materials of the semiconductor that can be used in the transistor, silicon-based semiconductor materials have been widely known, but oxide semiconductors have been attracting attention as alternative materials.

For example, a transistor including an amorphous oxide semiconductor layer containing indium (In), gallium (Ga), and zinc (Zn) is disclosed in Patent Document 1.

Techniques for improving carrier mobility by stacking oxide semiconductor layers are disclosed in Patent Documents 2 and 3.

It is known that a transistor including an oxide semiconductor layer has an extremely small leakage current when the transistor is off. For example, a low-power-consumption CPU utilizing the small leakage current characteristic of a transistor including an oxide semiconductor layer is disclosed (see Patent Document 4).

REFERENCE

Patent Documents

[Patent Document 1] Japanese Published Patent Application No. 2006-165528
[Patent Document 2] Japanese Published Patent Application No. 2011-124360
[Patent Document 3] Japanese Published Patent Application No. 2011-138934
[Patent Document 4] Japanese Published Patent Application No. 2012-257187
[Patent Document 5] Japanese Published Patent Application No. 2012-074692

SUMMARY OF THE INVENTION

Miniaturization of transistors has been progressing with an increase in the degree of integration of circuits. The miniaturization of a transistor may cause deterioration of electrical characteristics, such as on-state current, off-state current, threshold voltage, and an S value (subthreshold swing), of the transistor (see Patent Document 5).

In view of the above, an object of the present invention is to provide a semiconductor device whose threshold voltage is adjusted; a semiconductor device in which deterioration of electrical characteristics which becomes more noticeable as miniaturization progresses can be suppressed; a highly integrated semiconductor device; a semiconductor device in which deterioration of on-state current characteristics is reduced; a semiconductor device with low power consumption; a highly reliable semiconductor device; a semiconductor device capable of holding data even when power supply is stopped; a semiconductor device with good characteristics; or a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first transistor and a second transistor. The first transistor includes a first oxide semiconductor, a first electrode electrically connected to the first oxide semiconductor, a first gate electrode overlapping with the first oxide semiconductor, and a first charge trap layer between the first oxide semiconductor and the first gate electrode. The second transistor includes a second oxide semiconductor, a second electrode electrically connected to the second oxide semiconductor and the first electrode, a second gate electrode overlapping with the second oxide semiconductor and electrically connected to the first electrode, and a second charge trap layer between the second oxide semiconductor and the second gate electrode. The number of electrons held in the first charge trap layer is larger than the number of electrons held in the second charge trap layer.

Another embodiment of the present invention is a method for manufacturing a semiconductor device. The semiconductor device includes a first transistor and a second transistor. The first transistor includes a first oxide semiconductor, a first electrode electrically connected to the first oxide semiconductor, a first gate electrode overlapping with the first oxide semiconductor, and a first charge trap layer between the first oxide semiconductor and the first gate electrode. The second transistor includes a second oxide semiconductor, a second electrode electrically connected to the second oxide semiconductor and the first electrode, a second gate electrode overlapping with the second oxide semiconductor and electrically connected to the first electrode, and a second charge trap layer between the second oxide semiconductor and the second gate electrode. By applying a potential to the first gate electrode, the first charge trap layer holds the larger number of electrons than the second charge trap layer.

Another embodiment of the present invention is an electronic device including a semiconductor device having the above structure and a display device or a battery.

Note that in the semiconductor device of one embodiment of the present invention, the oxide semiconductor may be replaced with another semiconductor.

One embodiment of the present invention can provide a semiconductor device whose threshold voltage is adjusted; a semiconductor device in which deterioration of electrical characteristics which becomes more noticeable as miniaturization progresses can be suppressed; a highly integrated semiconductor device; a semiconductor device in which deterioration of on-state current characteristics is reduced; a semiconductor device with low power consumption; a highly reliable semiconductor device; a semiconductor device capable of holding data even when power supply is stopped; a semiconductor device with good characteristics; or a novel semiconductor device, or can solve an object which is apparent from and can be derived from the description of the specification, the drawings, the claims, and the like.

BRIEF DESCRIPTION OF THE DRAWINGS

In the accompanying drawings:

FIGS. 2A to 2D illustrate band diagram examples of a semiconductor device of an embodiment;

FIGS. 23A to 23D are Cs-corrected high-resolution TEM images of a plane of a CAAC-OS;

DETAILED DESCRIPTION OF THE INVENTION

Figure 1A:
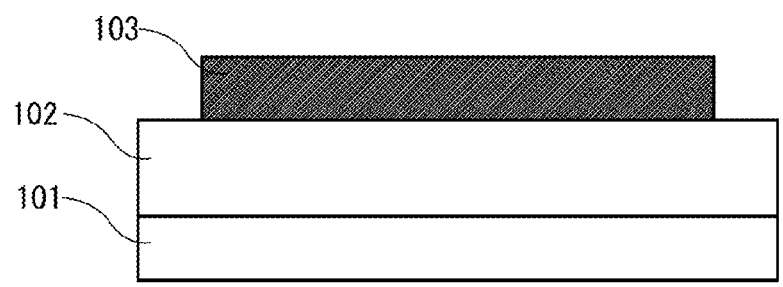
FIGS. 1A to 1D illustrate examples of a semiconductor device of an embodiment.

Embodiments will be described in detail with reference to drawings. Note that the present invention is not limited to the description below, and it is easily understood by those skilled in the art that a variety of modifications can be made to the modes and details without departing from the spirit and scope of the present invention. Therefore, the present invention should not be interpreted as being limited to the following description of the embodiments.

Note that in the structures described below, the same portions or portions having similar functions are denoted by the same reference numerals in common in different drawings and repetitive description thereof will be omitted.

Note that functions of a "source" and a "drain" of a transistor are sometimes replaced with each other when a transistor of opposite polarity is used or when the direction of current flowing is changed in circuit operation, for example. Therefore, the terms "source" and "drain" can be replaced with each other in this specification.

In this specification, a voltage usually refers to a potential difference between a given potential and a reference potential (e.g., a source potential or a ground potential (GND)). A voltage can be referred to as a potential and vice versa.

Note that in this specification and the like, ordinal numbers such as "first" and "second" are used in order to avoid confusion among components and do not limit the components numerically.

In this specification, a "semiconductor (or semiconductor film)" includes characteristics of an "insulator (or insulating film)" in some cases when the conductivity is sufficiently low, for example. Further, it is difficult to strictly distinguish a "semiconductor" and an "insulator" from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Note that a "semiconductor (or semiconductor film)" includes characteristics of a "conductor (or conductive film)" in some cases when the conductivity is sufficiently high, for example. Further, it is difficult to strictly distinguish a "semiconductor" and a "conductor" from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

In this specification, an impurity in a semiconductor refers to, for example, elements other than the main components of a semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes the characteristics of the semiconductor include Group 1 elements, Group 2 elements, Group 14 elements, Group 15 elements, and transition metals other than the main components; specific examples are hydrogen (included in water), lithium, sodium, silicon, boron, phosphorus, carbon, and nitrogen. Further, in the case where the semiconductor is a silicon film, examples of an impurity which changes the characteristics of the semiconductor include oxygen, Group 1 elements, Group 2 elements, Group 13 elements, and Group 15 elements.

In this specification, the phrase "A has a region with a concentration B" includes, for example, "the concentration of the entire region in a region of A in the depth direction is B", "the average concentration in a region of A in the depth direction is B", "the median value of a concentration in a region of A in the depth direction is B", "the maximum value of a concentration in a region of A in the depth direction is B", "the minimum value of a concentration in a region of A in the depth direction is B", "a convergence value of a concentration in a region of A in the depth direction is B", and "a concentration in a region of A in which a probable value is obtained in measurement is B".

In this specification, the phrase "A has a region with a size B, a length B, a thickness B, a width B, or a distance B" includes, for example, "the size, the length, the thickness, the width, or the distance of the entire region in a region of A is B", "the average value of the size, the length, the thickness, the width, or the distance of a region of A is B", "the median value of the size, the length, the thickness, the width, or the distance of a region of A is B", "the maximum value of the size, the length, the thickness, the width, or the distance of a region of A is B", "the minimum value of the size, the length, the thickness, the width, or the distance of a region of A is B", "a convergence value of the size, the length, the thickness, the width, or the distance of a region of A is B", and "the size, the length, the thickness, the width, or the distance of a region of A in which a probable value is obtained in measurement is B".

Note that the channel length refers to, for example, a distance between a source (a source region or a source electrode) and a drain (a drain region or a drain electrode) in a region where a semiconductor and a gate electrode overlap with each other, a region where current flows in a semiconductor when a transistor is on, or a channel formation region in a top view of the transistor. In one transistor, channel lengths in all regions are not necessarily the same. In other words, the channel length of one transistor is not limited to one value in some cases. Therefore, in this specification, the channel length is any one of values, the maximum values, the minimum value, or the average value in a channel formation region.

The channel width refers to, for example, the length of a portion where a source and a drain face each other in a region where a semiconductor and a gate electrode overlap with each other, a region where current flows in a semiconductor when a transistor is on, or a channel formation region. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a channel formation region.

Note that depending on transistor structures, a channel width in a channel formation region actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional transmission electron microscope (TEM) image and the like.

Note that in the case where electric field mobility, a current value per channel width, and the like of a transistor are obtained by calculation, a surrounded channel width may be used for the calculation. In that case, a value might be different from one calculated by using an effective channel width.

Note that in this specification, the description "A has a shape such that an end portion extends beyond an end portion of B" may indicate, for example, the case where at least one of end portions of A is positioned on an outer side than at least one of end portions of B in a top view or a cross-sectional view. Thus, the description "A projects as compared with B" can be alternatively referred to as the description "one of end portions of A is positioned on an outer side than one of end portions of B".

In this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines ranges from 80° to 100°, and accordingly also includes the case where the angle ranges from 85° to 95°.

In this specification, trigonal and rhombohedral crystal systems are included in a hexagonal crystal system.

Note that in this specification, the terms "film" and "layer" can be interchanged depending on the case or circumstances. For example, the term "conductive layer" can be changed into the term "conductive film" in some cases. Also, the term "insulating film" can be changed into the term "insulating layer" in some cases.

Embodiment 1

In this embodiment, a structure and operation principles of a semiconductor device including a semiconductor layer, a charge trap layer, and a gate electrode, and a circuit that uses the semiconductor device will be described. FIG. 1A illustrates a semiconductor device including a semiconductor layer 101, a charge trap layer 102, and a gate electrode 103. The charge trap layer 102 can serve as a gate insulating layer.

Figure 1B:
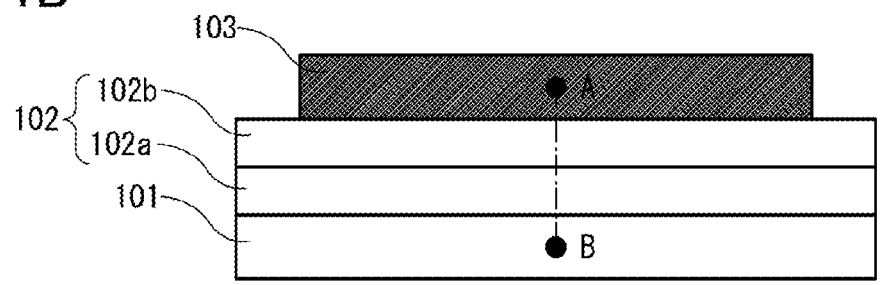
Figure 1C:
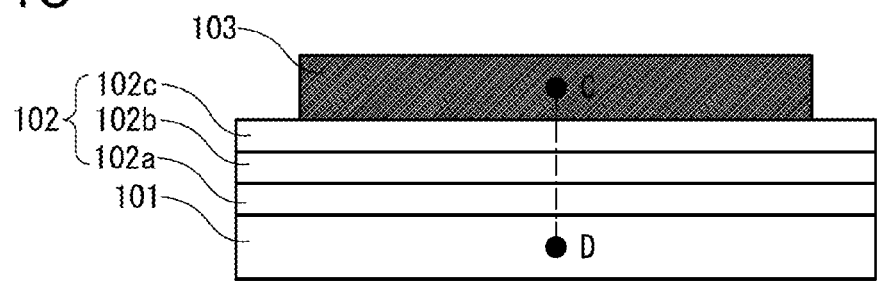
Figure 1D:
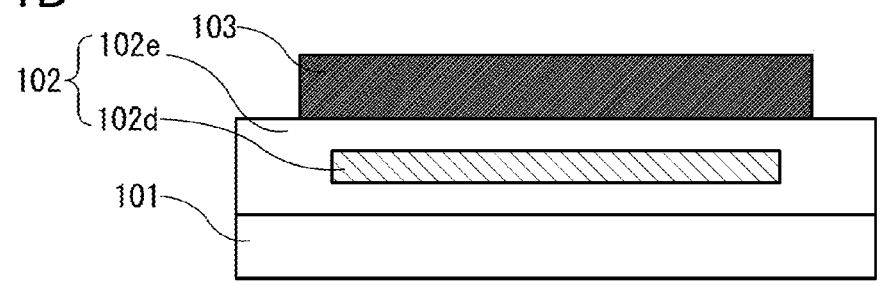

Here, the charge trap layer 102 may be a stacked body that includes a first insulating layer 102a and a second insulating layer 102b as illustrated in FIG. 1B, for example. Alternatively, the charge trap layer 102 may be a stacked body that includes the first insulating layer 102a, the second insulating layer 102b, and a third insulating layer 102c as illustrated in FIG. 1C, or a stacked body including four or more insulating layers. Alternatively, the charge trap layer 102 may include an electrically insulated conductive layer 102d in an insulator 102e as illustrated in FIG. 1D. The insulator 102e may be composed of a plurality of insulating layers.

FIG. 2A is an example of a band diagram between points A and B in the semiconductor device illustrated in FIG. 1B. In FIGS. 2A to 2D, Ec and Ev denote the conduction band minimum and the valence band maximum, respectively. In FIG. 2A, the potential of the gate electrode 103 is equal to the potential of a source electrode or a drain electrode (not illustrated).

In this example, the band gap of the first insulating layer 102a is larger than that of the second insulating layer 102b, and the electron affinity of the first insulating layer 102a is smaller than that of the second insulating layer 102b; however, the present invention is not limited to this example.

Electron trap states 104 exist at the interface between the first insulating layer 102a and the second insulating layer 102b or inside the second insulating layer 102b. FIG. 2B shows the state where a positive potential is applied to the gate electrode 103 to inject electrons into the electron trap states 104. Here, the potential applied to the gate electrode 103 may be higher than the potential of the source or drain electrode by 10 V or more. In addition, the potential applied to the gate electrode 103 to inject electrons into the electron trap states 104 is preferably higher than the highest potential applied to the gate electrode 103 after this process. The length of time during which the potential is applied to the gate electrode 103 may be short. Typically, 5 s or shorter is preferable.

The voltage is applied to the gate electrode 103; thus, electrons 105 existing in the semiconductor layer 101 and induced in the vicinity of the interface between the semiconductor layer 101 and the first insulating layer 102a move toward the gate electrode 103 having a higher potential. Then, some of the electrons 105 moving from the semiconductor layer 101 toward the gate electrode 103 are trapped in the electron trap states 104.

There are some methods to enable the electrons 105 to go over the barrier of the first insulating layer 102a to reach the second insulating layer 102b. For example, a method which uses Fowler-Nordheim tunnel current, a method which uses direct tunneling current, and a method which uses hot carriers are used. Here, direct tunneling current, which is the most possible to use, is described. The electrons 105 pass through the barrier of the first insulating layer 102a by the tunnel effect and reach the second insulating layer 102b. The thinner the first insulating layer 102a is, the more prominent the tunnel effect is. Moreover, the thinner the first insulating layer 102a is, the smaller the voltage applied to the gate electrode 103 can be. Note that, if the first insulating layer 102a is too thin, electrons trapped in the electron trap states 104 might sometimes move to the semiconductor layer 101 by the tunnel effect. Thus, the thickness of the first insulating layer 102a needs to be determined so that the trapped electrons cannot move.

Even when the first insulating layer 102a is relatively thick, the tunnel effect can be obtained by applying an appropriate voltage to the gate electrode 103.

In most cases, the current using hot carriers is extremely weak in particular when the potential difference between the gate electrode 103 and the semiconductor layer 101 is small (e.g., 5 V or lower), and treatment at a high temperature for a long time is needed to trap the needed number of electrons in the electron trap states 104. However, in the case of using the tunnel current, the potential difference between the gate electrode 103 and the semiconductor layer 101 is increased (e.g., 10 V or more), whereby the needed number of electrons can be trapped in the electron trap states 104 in a short time without performing treatment at a high temperature for a long time.

In other words, the potential difference between the gate electrode 103 and the semiconductor layer 101 is larger than the potential difference in normal use, whereby the needed number of electrons moves from the semiconductor layer 101 toward the gate electrode 103 by the tunnel effect, and some of them are trapped in the electron trap states 104. Here, the number of electrons trapped in the electron trap states 104 can be adjusted by the potential of the gate electrode 103.

The total number of electrons trapped in the electron trap states 104 increases linearly at first, and then, the rate of increase gradually decreases, and the total number of electrons converges at a certain value. The convergence value depends on the potential of the gate electrode 103. As the potential is higher, the number of trapped electrons is more likely to be large; however, it never exceeds the total number of electron trap states 104.

The electrons trapped in the electron trap states 104 are required not to transfer from the charge trap layer 102 to the other regions. For this, each thickness of the first and second insulating layers 102a and 102b is preferably set at a thickness at which the tunnel effect is not a problem in normal use. For example, the physical thickness is preferably more than 1 nm.

The thickness of the first insulating layer 102a is preferably 30 nm or less, because electron transfer is hindered if the thickness of the first insulating layer 102a is too large even when a high potential is applied to the gate electrode 103. Furthermore, if the thickness of the first and second insulating layers 102a and 102b is too large as compared with the channel length of the semiconductor device, the subthreshold value is increased to degrade the switching characteristics. For this reason, the channel length is more than or equal to four times, typically more than or equal to ten times as large as the equivalent silicon oxide thickness of the first and second insulating layers 102a and 102b. Note that when a so-called high-k material is used, the equivalent silicon oxide thickness is less than the physical thickness.

The thickness of the first insulating layer 102a is preferably more than or equal to 1 nm and less than or equal to 20 nm, further preferably more than or equal to 5 nm and less than or equal to 15 nm. The thickness of the second insulating layer 102b is preferably more than or equal to 5 nm and less than or equal to 30 nm, further preferably more than or equal to 10 nm and less than or equal to 25 nm.

It is also effective that the effective mass of a hole is extremely large or is localized in the semiconductor layer 101. In this case, the injection of holes from the semiconductor layer 101 to the first and second insulating layers 102a and 102b does not occur and consequently a phenomenon in which electrons trapped in the electron trap states 104 bond to holes and disappear does not occur.

Circuit design or material selection may be made so that no voltage at which electrons trapped in the first and second insulating layers 102a and 102b are released is applied. For example, in a material whose effective mass of holes is extremely large or is localized, such as an In—Ga—Zn-based oxide semiconductor, a channel is formed when the potential of the gate electrode 103 is higher than that of the source or drain electrode; however, when the potential of the gate electrode 103 is lower than that of the source or drain electrode, the material shows characteristics similar to an insulator in some cases. In this case, the electric field between the gate electrode 103 and the semiconductor layer 101 is extremely small and consequently electron conduction according to the tunnel effect is significantly decreased.

To hold electrons trapped in the electron trap states 104 inside the second insulating layer 102b or at the interface with another insulating layer, it is effective that the charge trap layer 102 is formed using three insulating layers as illustrated in FIG. 1C, that the electron affinity of the third insulating layer 102c is smaller than that of the second insulating layer 102b, and that the bandgap of the third insulating layer 102c is larger than that of the second insulating layer 102b. FIGS. 2C and 2D illustrate the examples. In FIG. 2C, the potential of the gate electrode 103 is equal to that of the source or drain electrode.

In this case, if the physical thickness of the third insulating layer 102c is large enough, electrons trapped in the electron trap states 104 can be held even when the second insulating layer 102b has a small thickness. As a material of the third insulating layer 102c, the same material as that of the first insulating layer 102a can be used. Alternatively, a material whose constituent elements are the same as those of the second insulating layer 102b but number of electron trap states is small enough may be used. The number (density) of electron trap states depends on the formation method.

The thickness of the third insulating layer 102c is preferably more than or equal to 1 nm and less than or equal to 25 nm, further preferably more than or equal to 5 nm and less than or equal to 20 nm.

FIG. 2D shows the state where the potential of the gate electrode 103 is higher than the potential of the source or drain electrode. Electrons 105 existing in the semiconductor layer 101 and induced in the vicinity of the interface between the semiconductor layer 101 and the first insulating layer 102a move toward the gate electrode 103 having a higher potential. Then, some of the electrons 105 moving from the semiconductor layer 101 toward the gate electrode 103 are trapped in the electron trap states 104 in the second insulating layer 102b. The band gap of the second insulating layer 102b is smaller than those of the first and third insulating layers 102a and 102c; thus, the trapped electrons can be held.

Furthermore, when the electrically insulated conductive layer 102d is surrounded by the insulator 102e as illustrated in FIG. 1D, electrons can be trapped in the conductive layer 102d according to the above principle. Here, when the work function of the conductive layer 102d is large, an energy barrier to the insulator 102e is high and consequently the trapped electrons can be prevented from moving out from the conductive layer 102d.

In the above structure, each of the first to third insulating layers 102a to 102c may be composed of a plurality of insulating layers. A plurality of insulating layers containing the same constituent elements and formed by different formation methods may be used.

For example, when the first and second insulating layers 102a and 102b are formed using insulating layers composed of the same constituent elements (e.g., hafnium oxide), the first insulating layer 102a may be formed by a CVD method or an ALD method and the second insulating layer 102b may be formed by a sputtering method.

As the CVD method, various methods can be employed: a thermal CVD method, a photo CVD method, a plasma CVD method, an MOCVD method, or the like can be used. Thus, insulating films may be formed by different CVD methods.

In general, an insulating layer formed by a sputtering method includes more defects and stronger electron trapping characteristics than an insulating layer formed by a CVD method or an ALD method. From this reason, the second insulating layer 102b may be formed by a sputtering method and the third insulating layer 102c may be formed by a CVD method or an ALD method when the second and third insulating layers 102b and 102c contain the same constituent elements.

When the second insulating layer 102b is formed using a plurality of insulating layers containing the same constituent elements, one insulating layer may be formed by a sputtering method and another insulating layer may be formed by a CVD method or an ALD method.

As described above, the threshold voltage of a semiconductor device is increased (shifts in the positive direction) by the trap of electrons in the charge trap layer 102. In particular, when the semiconductor layer 101 is formed using a wide bandgap material, a source-drain current when the potential of the gate electrode 103 is 0 V can be significantly decreased.

For example, the source-drain current density when the potential of the gate electrode 103 is 0 V (a current value per micrometer of a channel width) of an In—Ga—Zn-based oxide whose bandgap is 3.2 eV can be 1 zA/μm ($1\times10^{-21}$ A/μm) or less, typically 1 yA/μm ($1\times10^{-24}$ A/μm) or less.

Figure 3A:
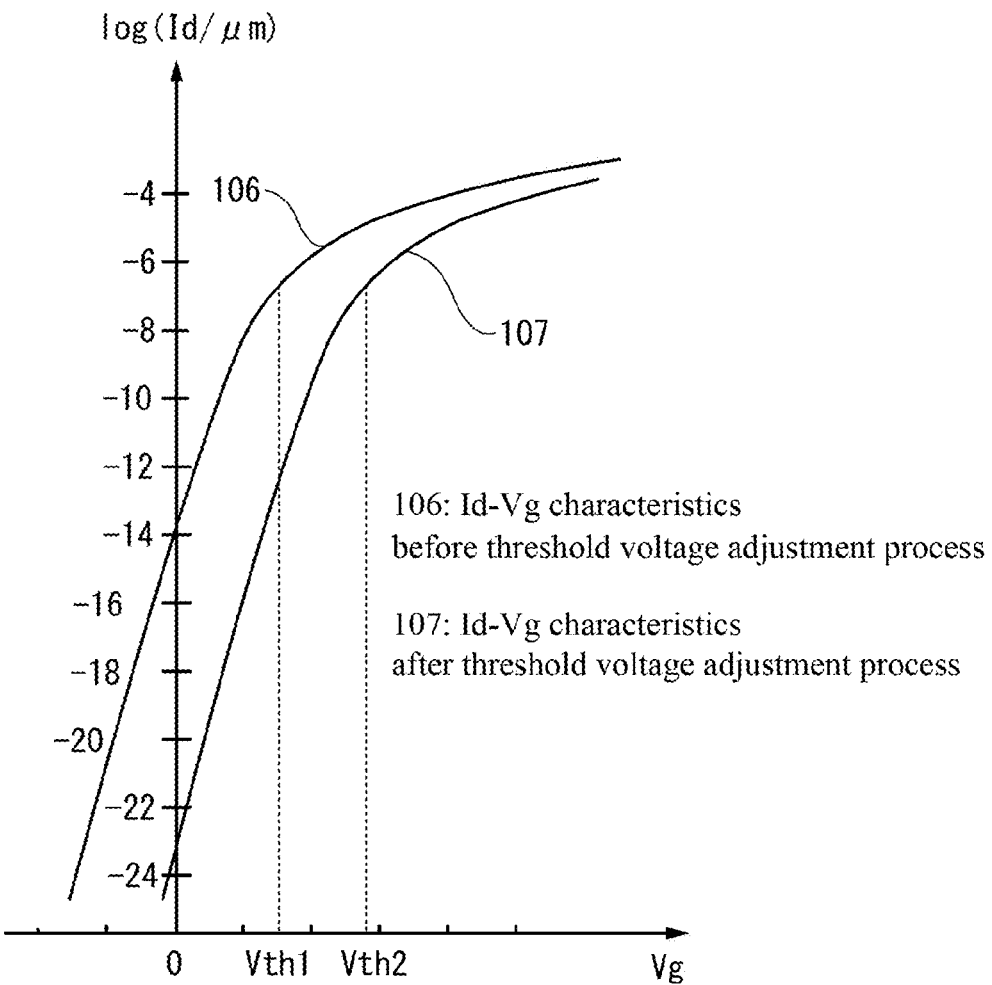
FIGS. 3A and 3B are a graph schematically showing characteristics of a semiconductor device of an embodiment and a diagram showing an example of a circuit in which the semiconductor device is used, respectively.

FIG. 3A schematically shows dependence of current per micrometer of channel width (Id) between source and drain electrodes on the potential of the gate electrode 103 (Vg) at room temperature, before and after electron trap in the charge trap layer 102. Note that each potential of the source electrode is 0 V and the potential of the drain electrode is +1 V. Although it is difficult to measure current smaller than 1 fA directly, it can be estimated from a value measured by another method, the subthreshold value, and the like.

As indicated by a curve 106, the threshold voltage of the semiconductor device is Vth1 at first. After electron trapping in the charge trap layer 102, the threshold voltage is increased (shifts in the positive direction) to become Vth2. As a result, the current density when Vg=0 becomes 1 aA/μm ($1\times10^{-18}$ A/μm) or less, for example, greater than or equal to 1 yA/μm and less than or equal to 1 zA/μm.

Figure 3B:
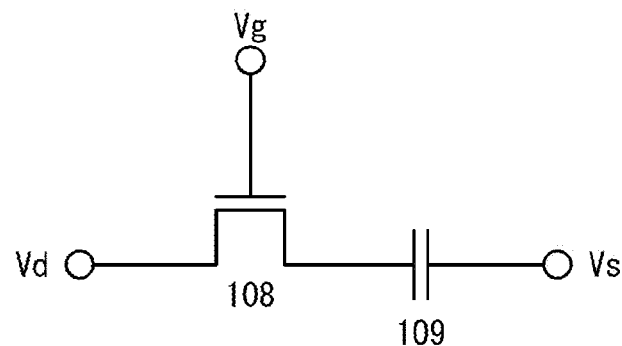

FIG. 3B illustrates a circuit in which charge stored in a capacitor 109 is adjusted by a transistor 108. Leakage current between electrodes of the capacitor 109 is ignored. The capacitance of the capacitor 109 is 1 fF, the potential of the capacitor 109 on the transistor 108 side is +1 V, and the potential of Vd is 0 V.

The curve 106 in FIG. 3A denotes the Id-Vg characteristics of the transistor 108 and the channel width is 0.1 μm, in which case the source-drain current when the potential of the gate electrode 103 is 0 V is approximately 1 fA and the resistivity of the transistor 108 at this time is approximately $1\times10^{15}$ Ω. Accordingly, the time constant of a circuit composed of the transistor 108 and the capacitor 109 is approximately 1 s. This means that most of the charge stored in the capacitor 109 is lost in approximately 1 s.

The curve 107 in FIG. 3A denotes the Id-Vg characteristics of the transistor 108 and the channel width is 0.1 μm, in which case the source-drain current when the potential of the gate electrode 103 is 0 V is approximately 1 yA and the resistivity of the transistor 108 at this time is approximately $1\times10^{24}$ Ω. Accordingly, the time constant of the circuit composed of the transistor 108 and the capacitor 109 is approximately $1\times10^9$ s (=approximately 31 years). This means that one-third of the charge stored in the capacitor 109 is left after 10 years.

From this, charge can be held for 10 years in a simple circuit composed of a transistor and a capacitor without applying such a large voltage. This can be applied to various kinds of memory devices.

The increase in the threshold voltage depends on the density of electrons trapped in the charge trap layer 102. For example, in the semiconductor device illustrated in FIG. 1B, in the case where electrons are trapped only at the interface between the first insulating layer 102a and the second insulating layer 102b, the threshold voltage is increased by Q/C, where Q is the surface density of trapped electrons and C is the capacitance value of the first insulating layer 102a.

The process through which the threshold voltage is adjusted is also referred to as a threshold voltage adjustment process. In the threshold voltage adjustment process, the potential is applied to the gate electrode 103 to trap electrons in the charge trap layer 102. Here, the potential applied to the gate electrode 103 in the threshold voltage adjustment process is preferably a high potential that is not used in normal use.

Note that the number of electrons trapped in the charge trap layer 102 also depends on the length of time for the threshold voltage adjustment process and thus a desired threshold voltage can be obtained by adjusting time for the threshold voltage adjustment process.

Any of a variety of materials can be used for the gate electrode 103. For example, a conductive layer of Al, Ti, Cr, Co, Ni, Cu, Y, Zr, Mo, Ru, Ag, Ta, W, or the like can be used. The gate electrode 103 may have a stacked-layer structure of any of these materials. Alternatively, a conductive layer containing nitrogen may be used for the gate electrode 103. For example, a titanium nitride layer over which a tungsten layer is stacked, a tungsten nitride layer over which a tungsten layer is stacked, a tantalum nitride layer over which a tungsten layer is stacked, or the like can be used as the gate electrode 103.

Note that the work function of the gate electrode 103 that faces the semiconductor layer 101 is one factor determining the threshold voltage of the semiconductor device; in general, as the work function of a material is smaller, the threshold voltage becomes lower. However, as described above, the threshold voltage can be adjusted by adjusting the number of trapped electrons in the charge trap layer 102; accordingly, the range of choices for the material of the gate electrode 103 can be widened.

Any of a variety of materials can be used for the semiconductor layer 101. For example, other than silicon, germanium, and silicon germanium, any of a variety of oxide semiconductors described later can be used.

Any of a variety of materials can be used for the first insulating layer 102a. For example, an insulating layer containing one or more kinds selected from magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide can be used.

The second insulating layer 102b can be an insulating layer containing one or more kinds selected from hafnium oxide, aluminum oxide, tantalum oxide, aluminum silicate, silicon nitride, and the like, for example.

The third insulating layer 102c can be an insulating layer containing one or more kinds selected from magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide, for example.

The conductive layer 102d can be formed using any kind of materials. For example, a conductive layer of Al, Ti, Cr, Co, Ni, Cu, Y, Zr, Mo, Ru, Ag, Ta, W, Pt, Pd, or the like can be used. The conductive layer 102d may have a stacked-layer structure of any of these materials. Alternatively, a conductive layer containing nitrogen may be used as the conductive layer 102d.

In particular, as a material having a large work function, a metal of the platinum group such as platinum or palladium: a nitride such as indium nitride, zinc nitride, In—Zn-based oxynitride, In—Ga-based oxynitride, or In—Ga—Zn-based oxynitride; or the like may be used.

Any of a variety of materials can be used for the insulator 102e. For example, silicon oxide, silicon nitride, silicon oxynitride, silicon nitride oxide, aluminum oxide, or tantalum oxide can be used.

The semiconductor device in which the needed number of electrons is trapped in the charge trap layer 102 as described above is equivalent to a general MOS-type semiconductor device except that the threshold voltage has a specific value.

The threshold voltage adjusted by the above method is determined by the potential difference between the semiconductor layer 101 and the gate electrode 103 during the process. Thus, the threshold voltages of a plurality of transistors can be appropriate values depending on the intended use of the transistors, by using different potential differences for the threshold voltage adjustment process.

Even in the case where a transistor has normally-on characteristics before the threshold voltage is adjusted, the electron trap in the charge trap layer makes the threshold voltage of the transistor shift in the positive direction and makes the transistor have normally-off characteristics as described above. In this case, the transistor on which the threshold adjustment process is performed can be used as an enhancement-mode transistor while a transistor on which the threshold adjustment process is not performed still has normally-on characteristics, and can be used as a depletion-mode transistor. Then, as an example of a circuit including these transistors with different threshold voltages obtained by performing and not performing the threshold adjustment process, a semiconductor device including an inverter is described. Note that in this embodiment, n-channel transistors are used to form a circuit including transistors with the same conductivity.

As an inverter circuit formed with transistors with the same conductivity, there are a circuit formed by a combination of an enhancement-mode transistor and a depletion-mode transistor (hereinafter, referred to as an EDMOS circuit), a circuit formed by a combination of enhancement-mode transistors (hereinafter, referred to as an EEMOS circuit), and an ERMOS circuit formed by a combination of an enhancement-mode transistor and a resistor. Note that an n-channel transistor with a positive threshold voltage is defined as an enhancement-mode transistor while an n-channel transistor with a negative threshold voltage is defined as a depletion-mode transistor, and these definitions apply to this specification.

Figure 4A:
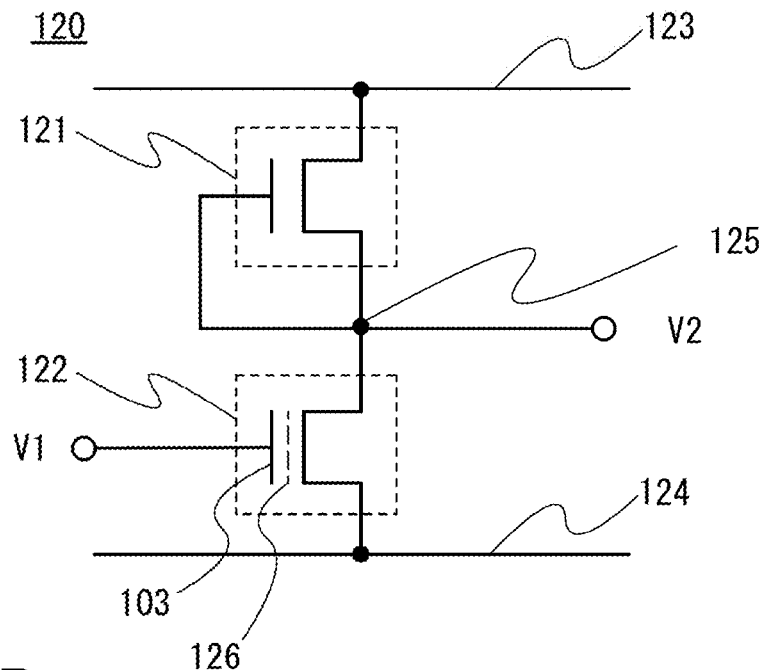
FIGS. 4A and 4B show examples of a logic circuit using a semiconductor device of an embodiment.

An inverter circuit 120 in FIG. 4A includes a transistor 121 and a transistor 122. Another transistor, a capacitor, or the like is also included as necessary. Each of the transistors 121 and 122 includes a charge trap layer 102. After a circuit is formed, the above-described threshold voltage adjustment process is performed on the transistor 122. Note that as shown in FIG. 4A, the transistor with the changed threshold voltage because of including electrons 126 in the charge trap layer 102 is represented by a symbol that is different from the symbol for a normal transistor. In this example, a transistor having any of the structures in FIGS. 1A to 1D is used.

Here, the transistor 121 is preferably normally on, that is, a depletion-mode transistor. The transistor 122 is preferably normally off, that is, an enhancement-mode transistor. Thus, a high potential is applied to a gate electrode of the transistor 122 to trap electrons in a charge trap layer of the transistor 122, while a high potential is not applied to a gate electrode of the transistor 121 not to trap electrons in a charge trap layer of the transistor 121.

In the inverter circuit 120 in FIG. 4A, the transistors 121 and 122 are placed between a power supply line 123 and a power supply line 124, and the gate electrode and a source electrode or a drain electrode of the transistor 121 and a source electrode or a drain electrode of the transistor 122 are electrically connected to a node 125. Note that an input terminal V1 is connected to the gate electrode of the enhancement-mode transistor, and an output terminal V2 is connected to the node 125.

Figure 4B:
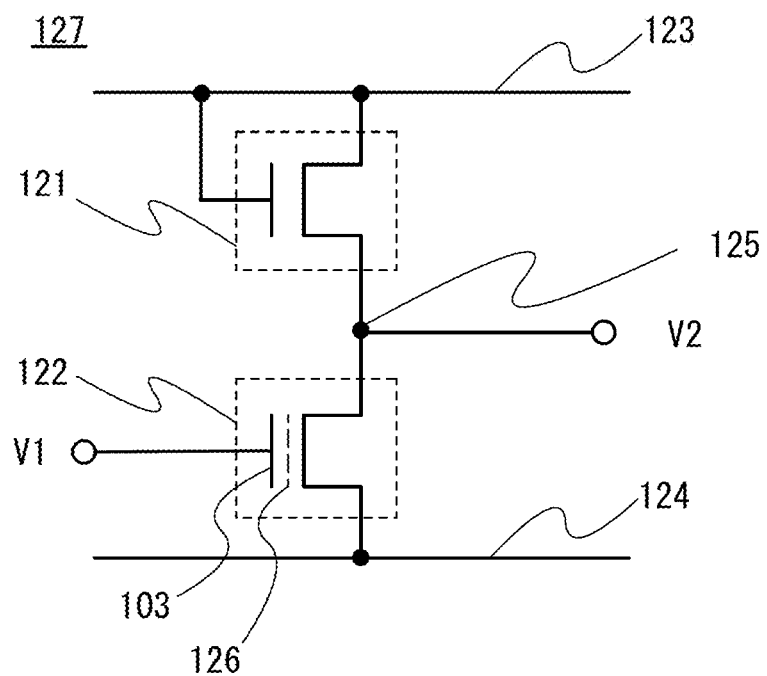

In an inverter circuit 127 in FIG. 4B, the transistors 121 and 122 are placed as in FIG. 4A; however, the gate electrode of the transistor 121 is electrically connected to the power supply line 123 instead of the node 125 unlike in FIG. 4A.

The threshold voltage adjustment can be performed as follows. First, the potentials of the power supply lines 123 and 124 are set to 0 V. Then, to the gate electrode 103 of the transistor 122, an appropriate potential of at least +10 V or more is applied for a short time, typically 5 s or shorter. As a result, the threshold voltage of the transistor 122 shifts in the positive direction and becomes an appropriate value. Since a potential is not applied to the gate electrode of the transistor 121, the threshold voltage of the transistor 121 does not change from the initial value.

Note that the threshold voltage of the transistor 122 before the threshold voltage adjustment process may be 0 V or lower or may be a value for generating an appropriate source-drain current when the potential of the gate electrode 103 is 0 V.

When the threshold voltage is adjusted to an appropriate value by making the charge trap layer trap electrons as described above, it is preferable to avoid further addition of electrons to the charge trap layer in normal use after that. For example, further addition of electrons means a further increase in threshold voltage, resulting in circuit deterioration.

In the inverter circuit 120 in FIG. 4A, for example, the above problem can be solved by setting the potential applied to the gate electrode 103 of the transistor 122 in the threshold voltage adjustment process to be higher than the potential that is used in the inverter circuit in normal use after the threshold voltage adjustment process. That is, by setting the potential applied to the gate electrode 103 in the threshold voltage adjustment process to be a potential that is not used in normal use, it is possible to avoid further addition of electrons to the charge trap layer in normal use.

Figure 5A:
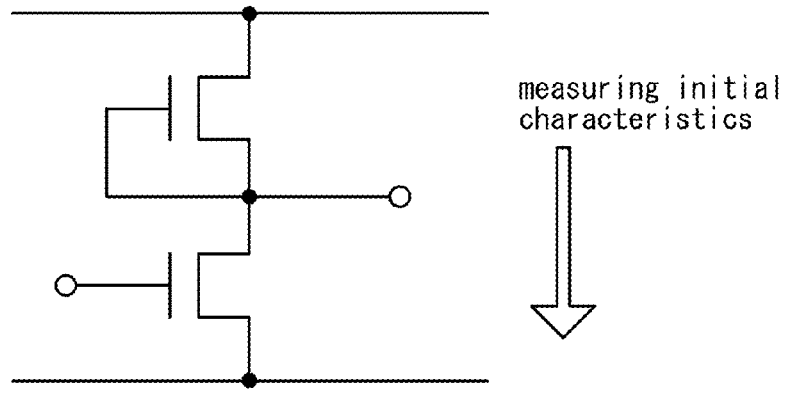
FIGS. 5A to 5C illustrate manufacturing steps of a semiconductor device.
Figure 5B:
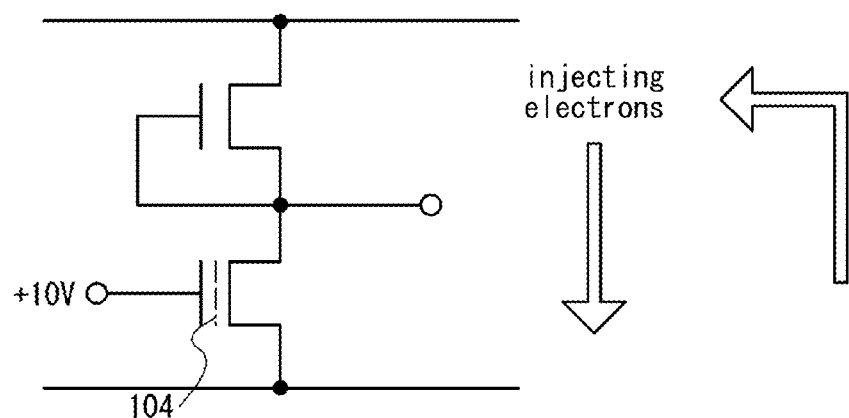
Figure 5C:
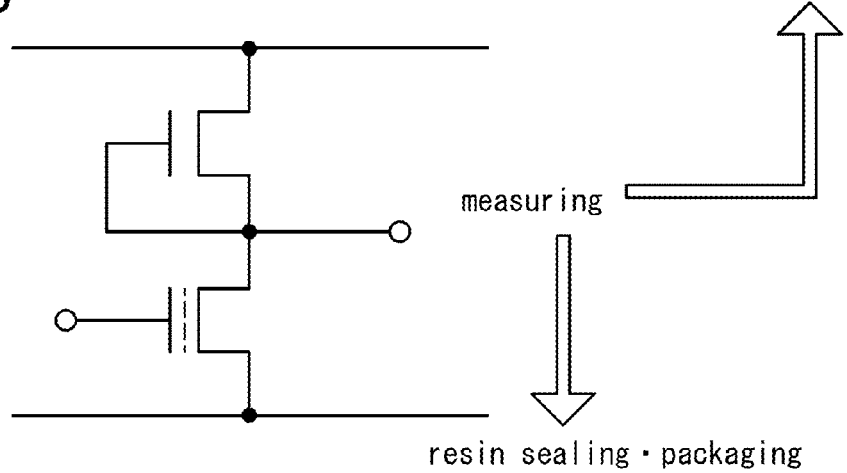

As the threshold voltage adjustment process for the transistor, steps illustrated in FIGS. 5A to 5C can be used, for example. First, as illustrated in FIG. 5A, initial characteristics of finished devices including the inverter circuit are measured to select conforming items. Here, items without malfunctions that cannot be recovered due to a break in a wire or the like are regarded as conforming items. Threshold voltage anomalies are not the criterion for selection because threshold voltages have not been adjusted yet.

Then, as in FIG. 5B, a high potential that is not used in normal use (e.g., +10 V) is applied to a gate electrode of a transistor that is to be an enhancement-mode transistor, and electrons are injected. That is, electrons are trapped in the charge trap layer. This operation is performed in the above-described manner.

Then, measurement is performed again as in FIG. 5C. One criterion for conforming items is that the threshold voltage is adjusted as planned. At this stage, display devices with threshold voltage anomalies may be regarded as nonconforming items and may again be subjected to electron injection. Conforming items are shipped.

This example of including transistors with different threshold voltages in one device can be employed in other devices without limitation to the above inverter. Furthermore, an example of including a plurality of transistors with different threshold voltages in one device can also be employed in other devices.

In this embodiment, when electrons are injected into the charge trap layer of the transistor 122, the voltage is applied to the input terminal V1; however, the present invention is not limited thereto. For example, another wiring electrically connected to the gate electrode 103 may be provided, and the potential difference between the gate electrode 103 and the source electrode or the drain electrode may be provided by changing the potential of the power supply line 124.

Figure 6A:
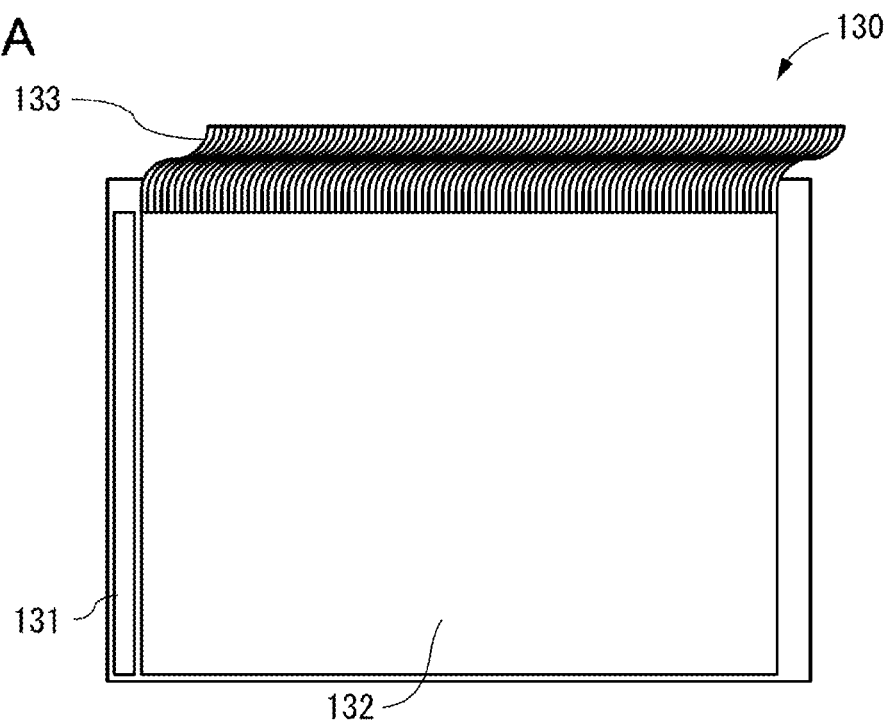
FIGS. 6A and 6B show examples of a display device of an embodiment and a microprocessor of an embodiment, respectively.

FIG. 6A schematically shows a display device 130. The display device 130 includes a driver region 131, a display region 132, an external connection terminal (e.g., an FPC 133), and the like. When the display device 130 is of an active matrix type, for example, transistors are used in the driver region 131 and the display region 132.

Here, for example, the threshold voltages of the transistors used in the driver region 131 may be higher than those of the transistors in the display region 132. In that case, the threshold voltage adjustment process is preferably performed on the transistors used in the driver region 131 in the above manner. The threshold voltage adjustment process may be performed not only on the transistors used in the driver region 131 but also on the transistors used in the display region 132. Alternatively, the threshold voltage adjustment process may be performed only on the transistors used in the display region 132.

Figure 6B:
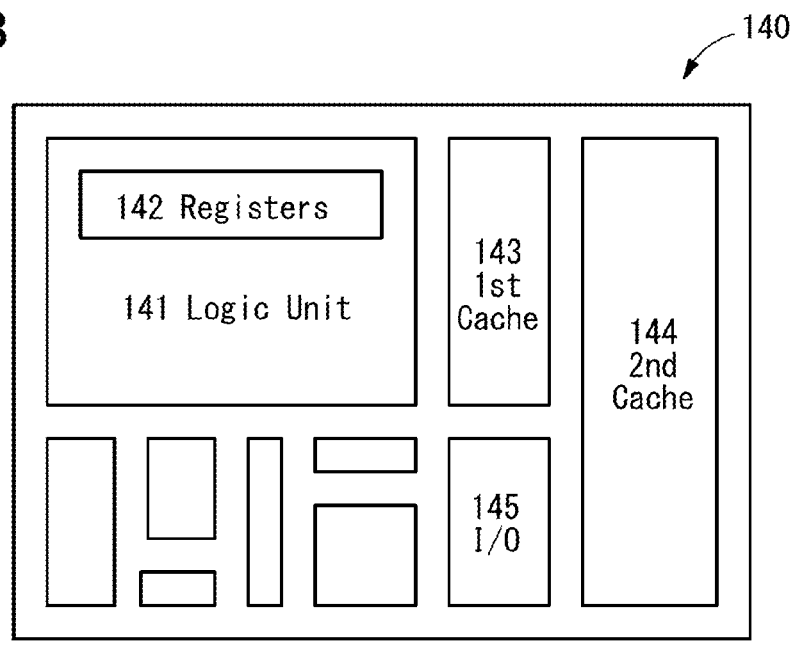

FIG. 6B is an example of a microprocessor 140. The microprocessor 140 includes a logical unit 141 (including registers 142), a first level cache 143, a second level cache 144, an I/O circuit 145, and the like. A memory device shown in FIG. 8 can be used as a memory device (the registers 142, the first level cache 143, the second level cache 144, or the like) used for these components.

Figure 7:
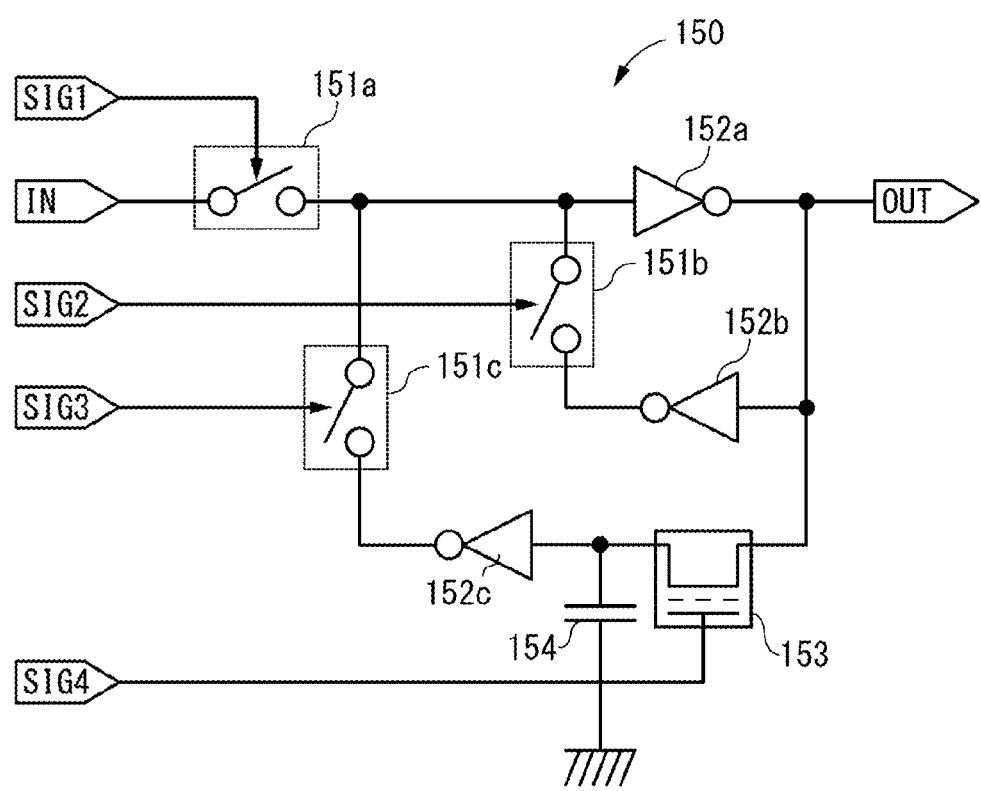
FIG. 7 shows an example of a memory element of an embodiment.

FIG. 7 is an example of a memory element 150 used in the registers 142. The memory element 150 includes a switch 151a, a switch 151b, a switch 151c, an inverter 152a, an inverter 152b, an inverter 152c, a transistor 153 having a structure similar to FIG. 1A, and a capacitor 154. The transistor 153 is a threshold voltage-adjusted transistor.

An example of the threshold voltage adjustment is as follows: the potentials other than the potential of the signal SIG4, i.e., the potentials of signals IN, OUT, SIG1, SIG2, and SIG3, and the power supply potentials of the inverters 152a to 152c are all the same (first potential), but only the potential of a signal SIG4 is kept at an appropriate potential (second potential) higher than the first potential. An appropriate number of electrons are then trapped in the charge trap layer of the transistor 153 to adjust the threshold voltage.

Data is held by the inverters 152a and 152b (output of one is connected to input of the other) while power is supplied from outside to the memory element 150. Since the inverters 152a and 152b consume power, the power supply may be stopped to reduce power consumption as needed. In that case, data (charge) is saved to the capacitor 154 and then the transistor 153 is turned off. Power might be off for a maximum of a few days to a few years, and the off-state resistance of the transistor 153 needs to be sufficiently high (e.g., the threshold voltage needs to be high).

Figure 8:
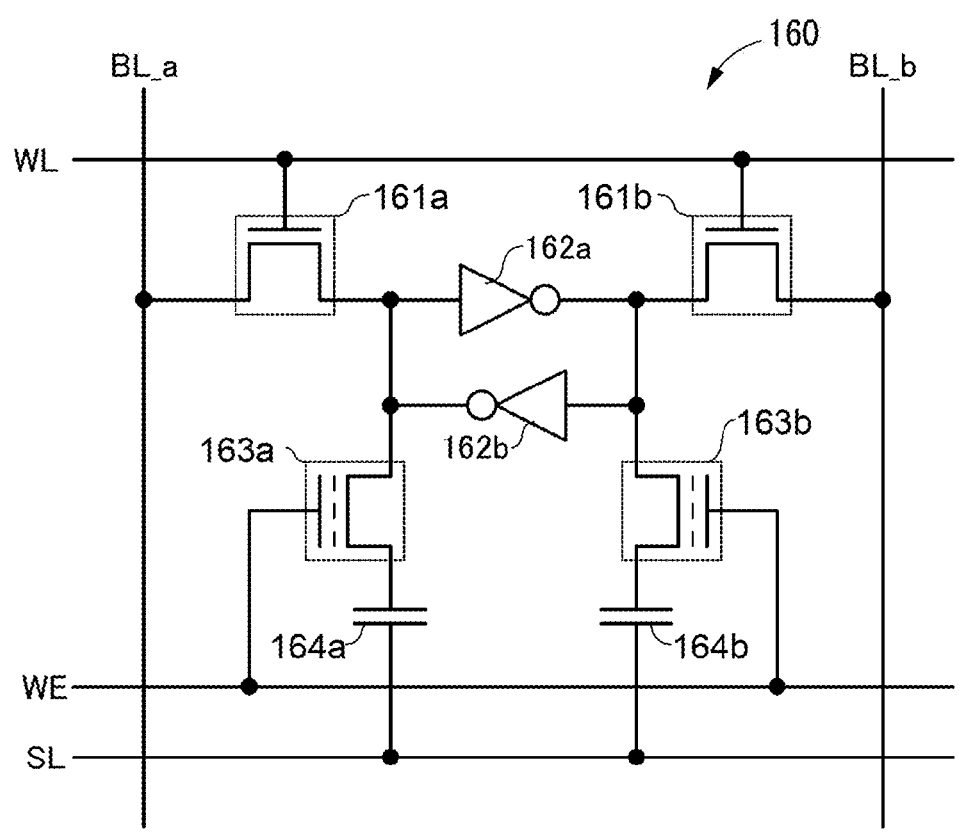
FIG. 8 shows an example of a memory element of an embodiment.

FIG. 8 is an example of a memory element 160 used in the first level cache 143. The memory element 160 includes a transistor 161a, a transistor 161b, an inverter 162a, an inverter 162b, transistors 163a and 163b each having a structure similar to FIG. 1A, and capacitors 164a and 164b. The transistors 163a and 163b are threshold voltage-adjusted transistors.

An example of the threshold voltage adjustment is as follows: the potentials of wirings other than a backup control line WE serving as a threshold voltage adjustment line, i.e., the potentials of a bit line BL_a, a bit line BL_b, and a word line WL, and the power supply potentials of inverters 162a and 162b, are all the same (first potential), but only the potential of the backup control line WE is kept at an appropriate potential (second potential) higher than the first potential. An appropriate number of electrons are then trapped in the charge trap layers of the transistors 163a and 163b to adjust the threshold voltages.

Note that the backup control line WE uses a potential sufficiently lower than the second potential in normal use; thus, the electrons trapped in the charge trap layer are less likely to move by driving the circuit, for example.

Data is held by the inverters 162a and 162b (output of one is connected to input of the other) while power is supplied from outside to the memory element 160. Since the inverters 162a and 162b consume power, the power supply may be stopped to reduce power consumption as needed. In that case, data (charge) is saved to the capacitors 164a and 164b and then the transistors 163a and 163b are turned off. Power might be off for a maximum of a few days to a few years, and the off-state resistance of the transistors 163a and 163b needs to be sufficiently high (e.g., the threshold voltage needs to be high).

Figure 9A:
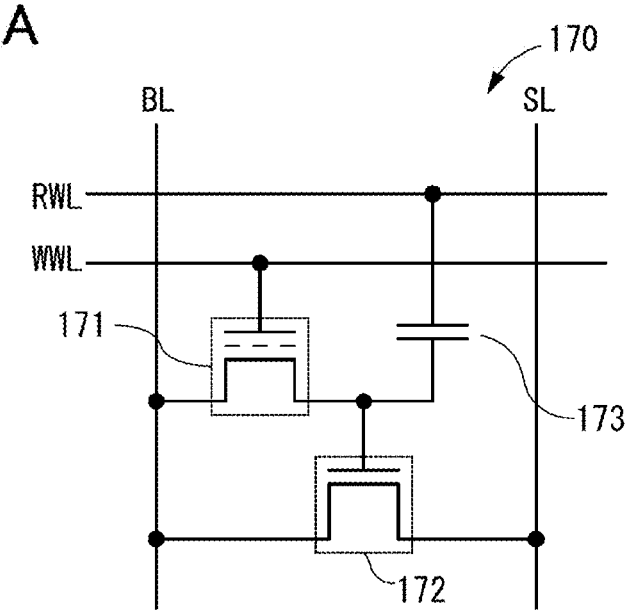
FIGS. 9A and 9B show examples of a memory element of an embodiment.

FIG. 9A is an example of a memory element 170 used for the first level cache 143 or the second level cache 144. The memory element 170 may include a transistor 171 and a transistor 172 each having a structure similar to that in FIG. 1A, and a capacitor 173. The transistor 171 is a threshold voltage-adjusted transistor.

An example of the threshold voltage adjustment is as follows: the potentials of wirings other than a write word line WWL serving as the threshold voltage adjustment line, i.e., the potentials of the bit line BL and a read word line RWL are all the same (first potential), and an appropriate potential (second potential) higher than the first potential is applied to only the write word line WWL. An appropriate number of electrons are then trapped in the charge trap layer of the transistor 171 to adjust the threshold voltage.

Figure 9B:
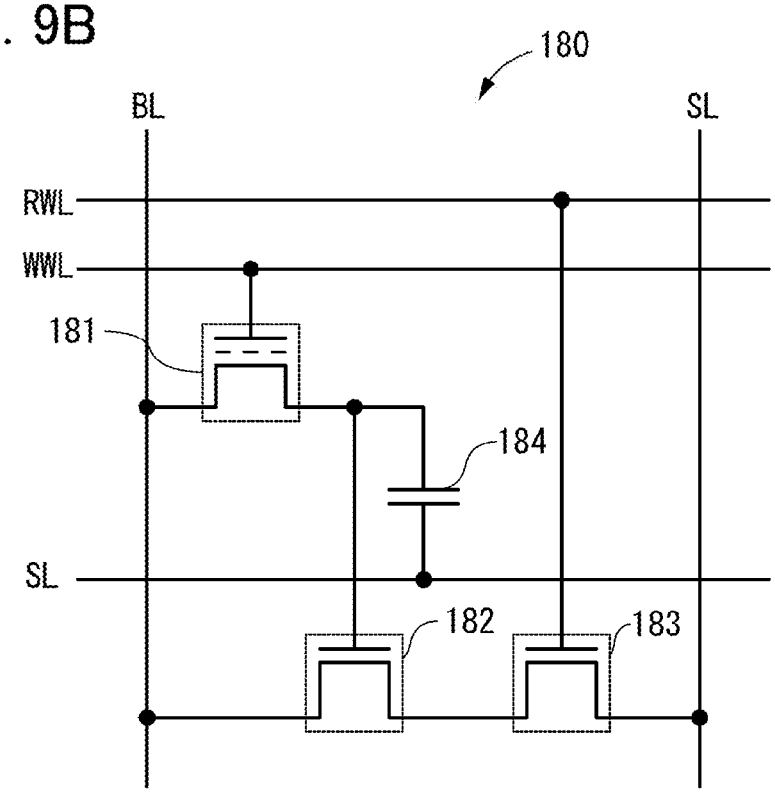

FIG. 9B is an example of a memory element 180 used for the first level cache 143 or the second level cache 144. The memory element 180 includes a transistor 181 having a structure similar to that in FIG. 1A, a transistor 182, a transistor 183, and a capacitor 184. The transistor 181 is a threshold voltage-adjusted transistor. The threshold voltage adjustment is preferably performed as that for the transistor 171 of the memory element 170 is performed. Note that the write word line WWL serves as the threshold voltage adjustment line; however, the potential in the threshold voltage adjustment is sufficiently higher than the potential in normal use. Thus, the electrons trapped in the charge trap layer are less likely to move by driving the circuit.

Because the memory element 170 stores data using the charge held by the capacitor 173, the transistor 171 needs to have high off-state resistance. The memory element 170 needs to respond at suitable high speed, and the transistor 171 also needs to have low on-state resistance. The charge hold period of the capacitor 173 used in a cache is one minute or shorter, and the threshold voltage of the transistor 171 is thus determined so that the memory element 170 can hold data for about one minute. This is also applied to the memory element 180.

Although the transistors 153, 163a, 163b, 171, and 181 in the memory elements 150, 160, 170, and 180 have the same function of holding charge in the capacitors 154, 164a, 164b, 173, and 184, the charge hold periods are different from one another and thus the threshold voltages need to be different.

In most cases, the transistors 153, 163a, 163b, 171, and 181 are formed in the same microprocessor 140 to have the same layer structure. It is preferable to adjust the threshold voltage of each of these transistors by changing conditions of the threshold voltage adjustment process. Here, their threshold voltage adjustment lines or the like are preferably configured to have different potentials from one another for the same period or for different periods. Alternatively, the same potentials may be applied for different periods.

Note that the threshold voltage adjustment is not necessarily performed on all of the transistors 153, 163a, 163b, 171, and 181. For example, the threshold voltage adjustment is not performed on the transistors 171 and 181 but is performed on all or some of the transistors 153, 163a, and 163b.

Figure 10A:
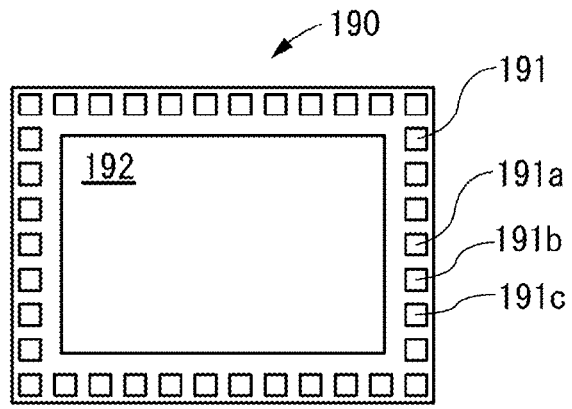
FIGS. 10A to 10C show manufacturing steps of a semiconductor device.

FIG. 10A is an example of a semiconductor chip 190 including the microprocessor 140 as in FIG. 6B. The semiconductor chip 190 includes a plurality of pads 191 and a device region 192.

For example, the signal SIG4 for adjusting the threshold voltage of the transistor 153 in the memory element 150 as in FIG. 7 is input from a pad 191a, the backup control line WE of the memory element 160 as in FIG. 8 is connected to a pad 191b, and the write word line WWL of the memory element 170 as in FIG. 9A is connected to a pad 191c. When different potentials are applied to the pads 191a, 191b, and 191c or appropriate potentials are applied to all or some of the other pads, the threshold voltages of transistors in memory elements are different from one another.

An example of the threshold voltage adjustment process is as follows: a state where the potentials of the pads 191a, 191b, and 191c are +10 V, +15 V, and +20 V, respectively, and the potentials of the other pads 191 are all 0 V is kept.

Another example of the threshold voltage adjustment process is as follows: the potentials of the pads 191a, 191b, and 191c are all fixed at +10 V, and the potential hold periods thereof are 50 ms, 100 ms, and 200 ms, respectively.

Figure 10B:
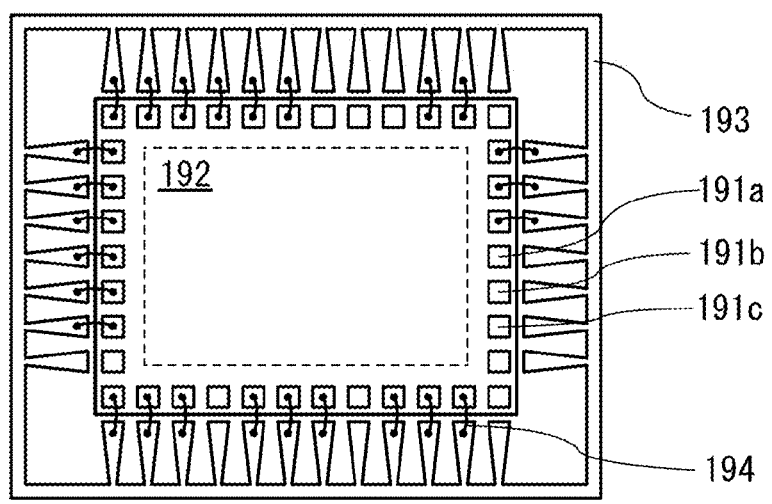

The timing of the threshold voltage adjustment process is not limited to the above. For example, the process may be performed after a lead frame 193 is connected to the pads 191 with bonding wires 194 as shown in FIG. 10B.

Here, for example, the pads 191a, 191b, and 191c are not connected to the lead frame 193, and all the pads that need to be connected to the outside are connected to the lead frame 193. Here, the potentials of the lead frame 193, the pads 191a, 191b, and 191c are 0 V, +10 V, +15 V, and +20 V, for example, which are appropriate potentials for threshold voltage adjustment, to perform the threshold voltage adjustment process.

Another example of the threshold voltage adjustment process can be as follows: the potentials of the pads 191a, 191b, and 191c are all fixed at +10 V, and the potential application periods thereof are 50 ms, 100 ms, and 200 ms, respectively.

Figure 10C:
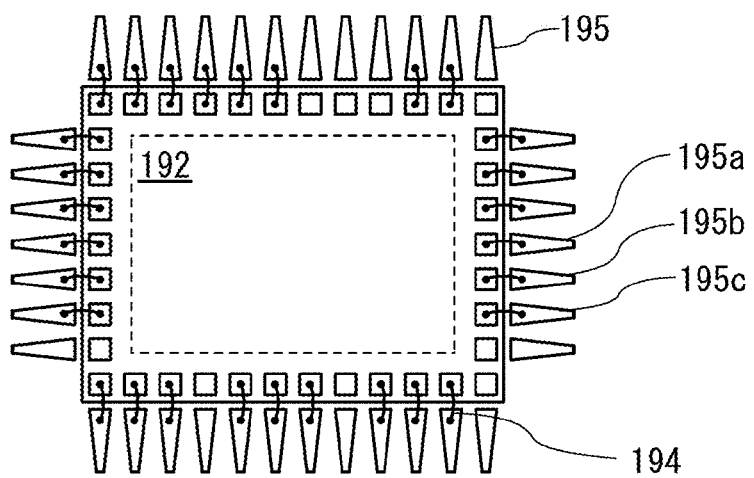

Furthermore, the threshold voltage adjustment process can be performed in the state shown in FIG. 10C where the lead frame 193 is divided into a plurality of leads 195 each of which are connected to the semiconductor chip. Here, all or some of the leads 195 is connected to all or part of the pads 191 with the bonding wires 194. Leads 195a, 195b, and 195c are connected to the pads 191a, 191b, and 191c, respectively with the bonding wires 194.

Here, the potentials of the leads 195a, 195b, and 195c are +10 V, +15 V, and +20 V, respectively, and all or some of the other leads 195 are 0 V for example, to perform the threshold voltage adjustment process.

Another example of the threshold voltage adjustment process can be as follows: the potentials of the leads 195a, 195b, and 195c are all fixed at +10 V, and the potential application periods thereof are 50 ms, 100 ms, and 200 ms, respectively.

Then, the semiconductor chip 190 is packaged. Note that the threshold voltage adjustment process can be performed even after the packaging in consideration of heat resistance of the package material.

In the above example, threshold voltages are adjusted by making the charge trap layer 102 trap electrons. Alternatively, threshold voltages can be adjusted by making the charge trap layer 102 trap holes.

For example, in this specification and the like, when it is explicitly described that X and Y are connected, the case where X and Y are electrically connected, the case where X and Y are functionally connected, and the case where X and Y are directly connected are included therein. Accordingly, a connection relation other than connection relations shown in the drawings and texts is also included, without being limited to a predetermined connection relation, for example, a connection relation shown in the drawings and texts.

Here, X and Y each denote an object (e.g., a device, an element, a circuit, a wiring, an electrode, a terminal, a conductive film, or a layer).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and E Note that for example, in the case where a signal output from X is transmitted to Y even when another circuit is interposed between X and Y, X and Y are functionally connected.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that "X and Y are electrically connected", the description is the same as the case where it is explicitly only described that "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 2

In this embodiment, a semiconductor device which can be used for the transistor and the like described in Embodiment 1 will be described with reference to drawings.

Figure 11A:
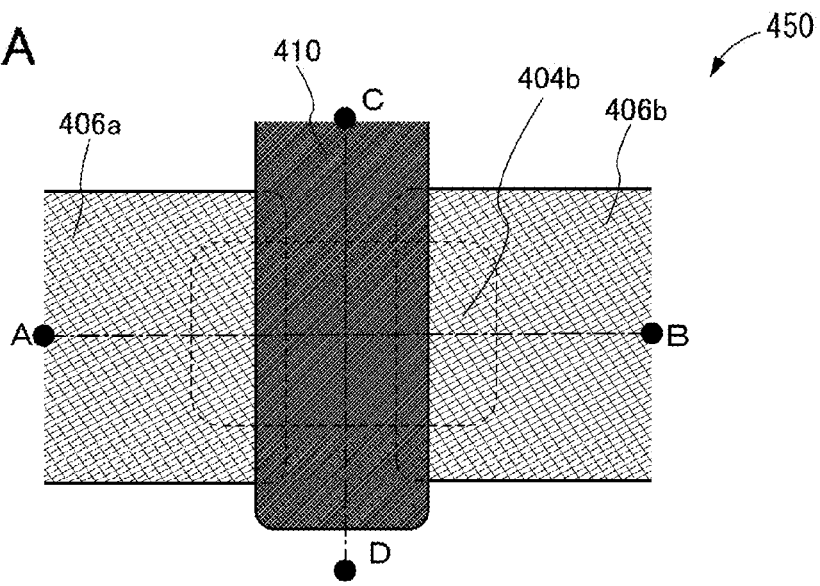
FIGS. 11A to 11C are a top view and cross-sectional views illustrating a transistor.
Figure 11B:
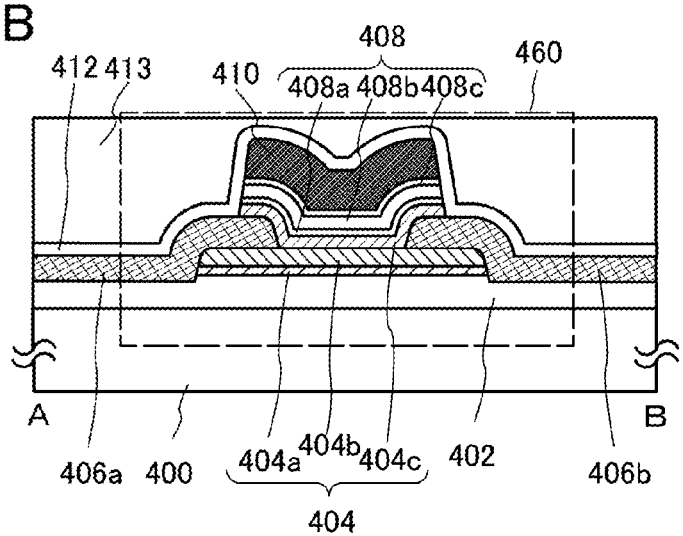
Figure 11C:
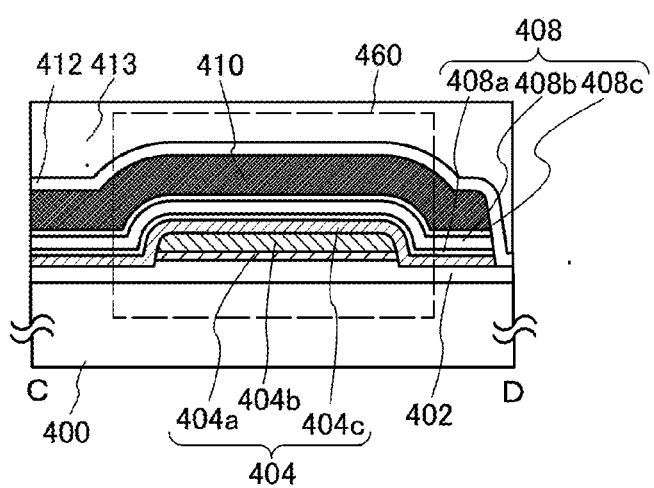

FIGS. 11A to 11C are a top view and cross-sectional views which illustrate the transistor 450. FIG. 11A is the top view. FIG. 11B illustrates a cross section taken along dashed-dotted line A-B in FIG. 11A. FIG. 11C illustrates a cross section taken along dashed-dotted line C-D in FIG. 11A. Note that for simplification of the drawing, some components in the top view in FIG. 11A are not illustrated. In some cases, the direction of the dashed-dotted line A-B is referred to as a channel length direction, and the direction of the dashed-dotted line C-D is referred to as a channel width direction.

The transistor 450 in FIGS. 11A to 11C includes a base insulating layer 402 including a projection and a depression over a substrate 400; an oxide semiconductor layer 404a and an oxide semiconductor layer 404b over the projection of the base insulating layer 402; a source electrode 406a and a drain electrode 406b over the oxide semiconductor layer 404a and the oxide semiconductor layer 404b; an oxide semiconductor layer 404c in contact with a bottom surface of the depression of the base insulating layer 402, a side surface between the depression and the projection of the base insulating layer 402, a side surface of the oxide semiconductor layer 404a, a side surface and a top surface of the oxide semiconductor layer 404b, the source electrode 406a, and the drain electrode 406b; a gate insulating layer 408 (corresponding to the charge trap layer 102 in FIG. 1C) over the oxide semiconductor layer 404c; a gate electrode 410 (corresponding to the gate electrode 103 in FIG. 1C) provided over and in contact with the gate insulating layer 408 and facing the top surface and the side surface of the oxide semiconductor layer 404b; and an oxide insulating layer 412 over the source electrode 406a, the drain electrode 406b, and the gate electrode 410.

In addition, the gate insulating layer 408 includes a first insulating layer 408a (corresponding to the first insulating layer 102a in FIG. 1C), a second insulating layer 408b (corresponding to the second insulating layer 102b in FIG. 1C), and a third insulating layer 408c (corresponding to the third insulating layer 102c in FIG. 1C) and functions as the charge trap layer described in Embodiment 1. The oxide semiconductor layers 404a, 404b, and 404c are collectively referred to as a multilayer semiconductor layer 404. The multilayer semiconductor layer 404 corresponds to the semiconductor layer 101 in FIG. 1C.

In the case where a material used for the second insulating layer 408b has a high relative dielectric constant, the second insulating layer 408b can be formed thick. For example, in the case of using hafnium oxide with a relative dielectric constant of 16, the second insulating layer 408b can be formed approximately four times as thick as the second insulating layer 408b using silicon oxide with a relative dielectric constant of 3.9. The increase in the thickness of the second insulating layer 408b is preferable in terms of preventing the movement of trapped electrons. Note that the thickness of the first insulating layer 408a is more than or equal to 1 nm and less than or equal to 20 nm, typically more than or equal to 5 nm and less than or equal to 15 nm. The thickness of the second insulating layer 408b is more than or equal to 5 nm and less than or equal to 30 nm, typically more than or equal to 10 nm and less than or equal to 25 nm. The thickness of the third insulating layer 408c is more than or equal to 1 nm and less than or equal to 25 nm, typically more than or equal to 5 nm and less than or equal to 20 nm.

Note that a channel length means a distance between a source (source region, source electrode) and a drain (drain region, drain electrode) in a region where a semiconductor layer overlaps with a gate electrode in the top view. That is, a channel length in FIG. 11A is a distance between the source electrode 406a and the drain electrode 406b in a region where the oxide semiconductor layer 404b overlaps with the gate electrode 410. A channel width means a length of a region where a source faces parallel to a drain and where a semiconductor layer and a gate electrode overlap with each other. That is, in FIG. 11A, a channel width is a length of a portion where the source electrode 406a and the drain electrode 406b face each other and where the oxide semiconductor layer 404b and the gate electrode 410 overlap with each other.

When the gate insulating layer 408 functions as a charge trap layer, electrons can be trapped in electron trap states existing at the interface between the first insulating layer 408a and the second insulating layer 408b, at the interface between the second insulating layer 408b and the third insulating layer 408c, or inside the second insulating layer 408b as described in Embodiment 1. The number of electrons trapped in the electron trap states can be adjusted by the potential of the gate electrode 410.

As illustrated in FIG. 11C, the gate electrode 410 electrically covers the oxide semiconductor layer 404b, and the on-state current is increased. This transistor structure is referred to as a surrounded channel (s-channel) structure. In the s-channel structure, current flows through an entire region of the oxide semiconductor layer 404b (bulk). Since current flows through the oxide semiconductor layer 404b, an adverse effect of interface scattering is unlikely to occur, leading to a high on-state current. Note that as the oxide semiconductor layer 404b is thicker, the on-state current can be increased.

In formation of a transistor with a short channel length and a short channel width, when an electrode, a semiconductor layer, or the like is processed at the same time when a resist mask is recessed, the electrode, the semiconductor layer, or the like has a rounded upper end portion (curved surface) in some cases. With this structure, the coverage with the gate insulating layer 408, the gate electrode 410, and the oxide insulating layer 412, which are to be formed over the oxide semiconductor layer 404b, can be improved. In addition, electric field concentration that might occur at end portions of the source electrode 406a and the drain electrode 406b can be reduced, which can suppress deterioration of the transistor.

By miniaturization of the transistor, a high degree of integration and a high density can be achieved. For example, the channel length of the transistor is less than or equal to 100 nm, preferably less than or equal to 40 nm, further preferably less than or equal to 30 nm, and still further preferably less than or equal to 20 nm, and the channel width of the transistor is less than or equal to 100 nm, preferably less than or equal to 40 nm, further preferably less than or equal to 30 nm, and still further preferably less than or equal to 20 nm. Even with such a small channel width, the transistor 450 can increase the on-state current by having the s-channel structure.

The substrate 400 is not limited to a simple supporting substrate, and may be a substrate where another device such as a transistor is formed. In that case, at least one of the gate electrode 410, the source electrode 406a, and the drain electrode 406b of the transistor 450 may be electrically connected to the above device.

The base insulating layer 402 can have a function of supplying oxygen to the multilayer semiconductor layer 404 as well as a function of preventing diffusion of impurities from the substrate 400. In the case where the substrate 400 is provided with another device as described above, the base insulating layer 402 also has a function as an interlayer insulating layer. In that case, since the base insulating layer 402 has an uneven surface, the base insulating layer 402 is preferably subjected to planarization treatment such as chemical mechanical polishing (CMP) treatment so as to have a flat surface.

The multilayer semiconductor layer 404 in the channel formation region of the transistor 450 has a structure in which the oxide semiconductor layer 404a, the oxide semiconductor layer 404b, and the oxide semiconductor layer 404c are stacked in this order from the substrate 400 side. The oxide semiconductor layer 404b is surrounded by the oxide semiconductor layer 404a and the oxide semiconductor layer 404c. As in FIG. 11C, the gate electrode 410 electrically covers the oxide semiconductor layer 404b.

Here, for the oxide semiconductor layer 404b, for example, an oxide semiconductor whose electron affinity (an energy difference between a vacuum level and the conduction band minimum) is higher than those of the oxide semiconductor layer 404a and the oxide semiconductor layer 404c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layer 404a and the oxide semiconductor layer 404c each contain one or more kinds of metal elements forming the oxide semiconductor layer 404b. For example, the oxide semiconductor layer 404a and the oxide semiconductor layer 404c are preferably formed using an oxide semiconductor whose conduction band minimum is closer to a vacuum level than that of the oxide semiconductor layer 404b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the gate electrode 410, a channel is formed in the oxide semiconductor layer 404b where the conduction band minimum is the lowest in the multilayer semiconductor layer 404. In other words, the oxide semiconductor layer 404c is formed between the oxide semiconductor layer 404b and the gate insulating layer 408, whereby a structure in which the channel of the transistor is provided in a region that is not in contact with the gate insulating layer 408 is obtained.

Further, since the oxide semiconductor layer 404a contains one or more metal elements contained in the oxide semiconductor layer 404b, an interface state is unlikely to be formed at the interface between the oxide semiconductor layer 404b and the oxide semiconductor layer 404a, compared with the interface between the oxide semiconductor layer 404b and the base insulating layer 402 on the assumption that the oxide semiconductor layer 404b is in contact with the base insulating layer 402. The interface state sometimes forms a channel, leading to a change in the threshold voltage of the transistor. Thus, with the oxide semiconductor layer 404a, a variation in the electrical characteristics of the transistor, such as threshold voltage, can be reduced. Further, the reliability of the transistor can be improved.

Furthermore, since the oxide semiconductor layer 404c contains one or more metal elements contained in the oxide semiconductor layer 404b, scattering of carriers is unlikely to occur at the interface between the oxide semiconductor layer 404b and the oxide semiconductor layer 404c, compared with the interface between the oxide semiconductor layer 404b and the gate insulating layer 408 on the assumption that the oxide semiconductor layer 404b is in contact with the gate insulating layer 408. Thus, with the oxide semiconductor layer 404c, the field-effect mobility of the transistor can be increased.

For the oxide semiconductor layer 404a and the oxide semiconductor layer 404c, for example, a material containing Al, Ti, Ga, Ge, Y, Zr, Sn, La, Ce, or Hf with a higher atomic ratio than that used for the oxide semiconductor layer 404b can be used. Specifically, an atomic ratio of any of the above metal elements in the oxide semiconductor layer 404a and the oxide semiconductor layer 404c is 1.5 times or more, preferably 2 times or more, further preferably 3 times or more as much as that in the oxide semiconductor layer 404b. Any of the above metal elements is strongly bonded to oxygen and thus has a function of suppressing generation of an oxygen vacancy in the oxide semiconductor layer 404a and the oxide semiconductor layer 404c. That is, an oxygen vacancy is less likely to be generated in the oxide semiconductor layer 404a and the oxide semiconductor layer 404c than in the oxide semiconductor layer 404b.

Note that when each of the oxide semiconductor layer 404a, the oxide semiconductor layer 404b, and the oxide semiconductor layer 404c is an In-M-Zn oxide containing at least indium, zinc, and M (M is a metal such as Al, Ti, Ga, Ge, Y, Zr, Sn, La, Ce, or Hf), and when the oxide semiconductor layer 404a has an atomic ratio of In to M and Zn which is $x_1:y_1:z_1$, the oxide semiconductor layer 404b has an atomic ratio of In to M and Zn which is $x_2:y_2:z_2$, and the oxide semiconductor layer 404c has an atomic ratio of In to M and Zn which is $x_3:y_3:z_3$, $y_1/x_1$ and $y_3/x_3$ is each preferably larger than $y_2/x_2$. $y_1/x_1$ and $y_3/x_3$ is each 1.5 times or more, preferably 2 times or more, further preferably 3 times or more as large as $y_2/x_2$. At this time, when $y_2$ is greater than or equal to $x_2$ in the oxide semiconductor layer 404b, the transistor can have stable electrical characteristics. However, when $y_2$ is 3 times or more as large as $x_2$, the field-effect mobility of the transistor is reduced; accordingly, $y_2$ is preferably less than 3 times $x_2$.

In the case where Zn and O are not taken into consideration, the proportion of In and the proportion of M in the oxide semiconductor layer 404a and the oxide semiconductor layer 404c are preferably less than 50 atomic % and greater than 50 atomic %, respectively, and further preferably less than 25 atomic % and greater than 75 atomic %, respectively. In addition, in the case where Zn and O are not taken into consideration, the proportion of In and the proportion of M in the oxide semiconductor layer 404b are preferably greater than 25 atomic % and less than 75 atomic %, respectively, and further preferably greater than 34 atomic % and less than 66 atomic %, respectively.

The thicknesses of the oxide semiconductor layer 404a and the oxide semiconductor layer 404c are each greater than or equal to 3 nm and less than or equal to 100 nm, preferably greater than or equal to 3 nm and less than or equal to 50 nm. The thickness of the oxide semiconductor layer 404b is greater than or equal to 3 nm and less than or equal to 200 nm, preferably greater than or equal to 3 nm and less than or equal to 100 nm, further preferably greater than or equal to 3 nm and less than or equal to 50 nm. In addition, the oxide semiconductor layer 404b is preferably thicker than the oxide semiconductor layer 404a and the oxide semiconductor layer 404c.

For the oxide semiconductor layer 404a, the oxide semiconductor layer 404b, and the oxide semiconductor layer 404c, an oxide semiconductor containing indium, zinc, and gallium can be used, for example. Note that the oxide semiconductor layer 404b preferably contains indium because carrier mobility can be increased.

Note that stable electrical characteristics can be effectively imparted to a transistor using an oxide semiconductor layer, by reducing the concentration of impurities in the oxide semiconductor layer to make the oxide semiconductor layer intrinsic or substantially intrinsic. The term "substantially intrinsic" refers to the state where an oxide semiconductor layer has a carrier density lower than $1\times10^{17}/cm^3$, preferably lower than $1\times10^{15}/cm^3$, further preferably lower than $1\times10^{13}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density. In addition, silicon in the oxide semiconductor layer forms an impurity level. The impurity level might become a trap, so that the electrical characteristics of the transistor might deteriorate. Accordingly, in the oxide semiconductor layer 404a, the oxide semiconductor layer 404b, and the oxide semiconductor layer 404c and at interfaces between these layers, the impurity concentration is preferably reduced.

In order to make the oxide semiconductor layer intrinsic or substantially intrinsic, in secondary ion mass spectrometry (SIMS), for example, the concentration of silicon at a certain depth of the oxide semiconductor layer or in a region of the oxide semiconductor layer is preferably lower than $1\times10^{19}$ atoms/cm$^3$, further preferably lower than $5\times10^{18}$ atoms/cm$^3$, still further preferably lower than $1\times10^{18}$ atoms/cm$^3$. Further, the concentration of hydrogen at a certain depth of the oxide semiconductor layer or in a region of the oxide semiconductor layer is preferably lower than or equal to $2\times10^{20}$ atoms/cm$^3$, further preferably lower than or equal to $5\times10^{19}$ atoms/cm$^3$, still further preferably lower than or equal to $1\times10^{19}$ atoms/cm$^3$, yet still further preferably lower than or equal to $5\times10^{18}$ atoms/cm$^3$. Further, the concentration of nitrogen at a certain depth of the oxide semiconductor layer or in a region of the oxide semiconductor layer is preferably lower than $5\times10^{19}$ atoms/cm$^3$, further preferably lower than or equal to $5\times10^{18}$ atoms/cm$^3$, still further preferably lower than or equal to $1\times10^{18}$ atoms/cm$^3$, yet still further preferably lower than or equal to $5\times10^{17}$ atoms/cm$^3$.

In the case where the oxide semiconductor layer includes crystals, high concentration of silicon or carbon might reduce the crystallinity of the oxide semiconductor layer. In order not to lower the crystallinity of the oxide semiconductor layer, for example, the concentration of silicon at a certain depth of the oxide semiconductor layer or in a region of the oxide semiconductor layer may be lower than $1\times10^{19}$ atoms/cm$^3$, preferably lower than $5\times10^{18}$ atoms/cm$^3$, further preferably lower than $1\times10^{18}$ atoms/cm$^3$. Further, the concentration of carbon at a certain depth of the oxide semiconductor layer or in a region of the oxide semiconductor layer may be lower than $1\times10^{19}$ atoms/cm$^3$, preferably lower than $5\times10^{18}$ atoms/cm$^3$, further preferably lower than $1\times10^{18}$ atoms/cm$^3$, for example.

A transistor in which the above-described highly purified oxide semiconductor layer is used for a channel formation region has an extremely low off-state current. In the case where the voltage between a source and a drain is set at about 0.1 V, 5 V, or 10 V, for example, the off-state current standardized on the channel width of the transistor can be as low as several yoctoamperes per micrometer to several zeptoamperes per micrometer.

Note that as the gate insulating layer of the transistor, an insulating layer containing silicon is used in many cases; thus, it is preferable that a region of the multilayer semiconductor layer, which serves as a channel, be not in contact with the gate insulating layer for the above-described reason. In the case where a channel is formed at the interface between the gate insulating layer and the multilayer semiconductor layer, scattering of carriers occurs at the interface, whereby the field-effect mobility of the transistor may be reduced. Also from the view of the above, it is preferable that the region of the multilayer semiconductor layer, which serves as a channel, be separated from the gate insulating layer.

Accordingly, with the multilayer semiconductor layer 404 having a stacked structure of the oxide semiconductor layers 404a, 404b, and 404c, a channel can be formed in the oxide semiconductor layer 404b; thus, the transistor can have high field-effect mobility and stable electrical characteristics.

Next, the band structure of the multilayer semiconductor layer 404 is described. For analyzing the band structure, a stacked film corresponding to the multilayer semiconductor layer 404 is formed. In the stacked film, In—Ga—Zn oxide with an energy gap of 3.5 eV is used for layers corresponding to the oxide semiconductor layer 404a and the oxide semiconductor layer 404c, and In—Ga—Zn oxide with an energy gap of 3.15 eV is used for a layer corresponding to the oxide semiconductor layer 404b.

The thickness of each of the oxide semiconductor layer 404a, the oxide semiconductor layer 404b, and the oxide semiconductor layer 404c was 10 nm. The energy gap was measured with the use of a spectroscopic ellipsometer (UT-300 manufactured by HORIBA Jobin Yvon). Further, the energy difference between the vacuum level and the valence band maximum was measured using an ultraviolet photoelectron spectroscopy (UPS) device (VersaProbe, ULVAC-PHI, Inc.).

Figure 12A:
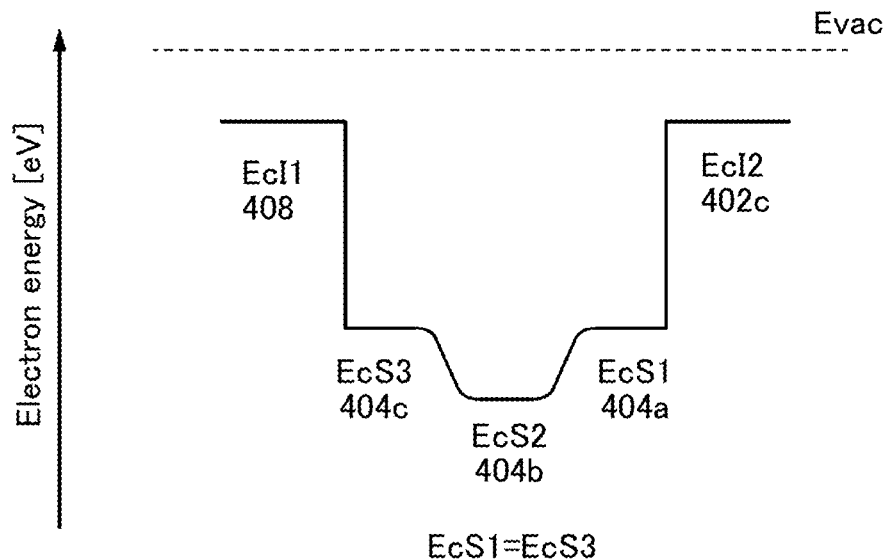
FIGS. 12A and 12B are schematic band diagrams of stacked semiconductor layers.

FIG. 12A is part of a schematic band structure showing an energy difference (electron affinity) between the vacuum level and the conduction band minimum of each layer, which is calculated by subtracting the energy gap from the energy difference between the vacuum level and the valence band maximum. FIG. 12A is a band diagram showing the case where silicon oxide layers are provided in contact with the oxide semiconductor layer 404a and the oxide semiconductor layer 404c. Here, Evac represents energy of the vacuum level, EcI1 and EcI2 represent the conduction band minimum of the silicon oxide layer, EcS1 represents the conduction band minimum of the oxide semiconductor layer 404a, EcS2 represents the conduction band minimum of the oxide semiconductor layer 404b, and EcS3 represents the conduction band minimum of the oxide semiconductor layer 404c.

As shown in FIG. 12A, the conduction band minimum continuously varies among the oxide semiconductor layer 404a, the oxide semiconductor layer 404b, and the oxide semiconductor layer 404c. This can be understood also from the fact that the constituent elements are common among the oxide semiconductor layer 404a, the oxide semiconductor layer 404b, and the oxide semiconductor layer 404c and oxygen is easily diffused among the oxide semiconductor layers 404a to 404c. Accordingly, the oxide semiconductor layer 404a, the oxide semiconductor layer 404b, and the oxide semiconductor layer 404c have a continuous physical property although they have different compositions in a stack.

The multilayer semiconductor layer 404 in which layers containing the same main components are stacked is formed to have not only a simple stacked-layer structure of the layers but also a continuous energy band (here, in particular, a well structure having a U shape in which the conduction band minimum continuously varies among the layers). In other words, the stacked-layer structure is formed such that there exist no impurities that form a defect level such as a trap center or a recombination center in an oxide semiconductor at each interface. If impurities exist between the stacked layers in the multilayer semiconductor layer, the continuity of the energy band is lost and carriers at the interface disappear by a trap or recombination.

Note that FIG. 12A shows the case where EcS1 and EcS3 are equal to each other; however, EcS1 and EcS3 may be different from each other. For example, part of the band structure in the case where EcS1 is higher than EcS3 is shown in FIG. 12B.

For example, when EcS1 is equal to EcS3, an In—Ga—Zn oxide whose atomic ratio of In to Ga and Zn is 1:3:2, 1:3:3, 1:3:4, 1:6:4, or 1:9:6 can be used for the oxide semiconductor layer 404a and the oxide semiconductor layer 404c and an In—Ga—Zn oxide whose atomic ratio of In to Ga and Zn is 1:1:1 or 3:1:2 can be used for the oxide semiconductor layer 404b. Further, when EcS1 is higher than EcS3, an In—Ga—Zn oxide whose atomic ratio of In to Ga and Zn is 1:6:4 or 1:9:6 can be used for the oxide semiconductor layer 404a, an In—Ga—Zn oxide whose atomic ratio of In to Ga and Zn is 1:1:1 or 3:1:2 can be used for the oxide semiconductor layer 404b, and an In—Ga—Zn oxide whose atomic ratio of In to Ga and Zn is 1:3:2, 1:3:3, or 1:3:4 can be used for the oxide semiconductor layer 404c, for example.

Figure 12B:
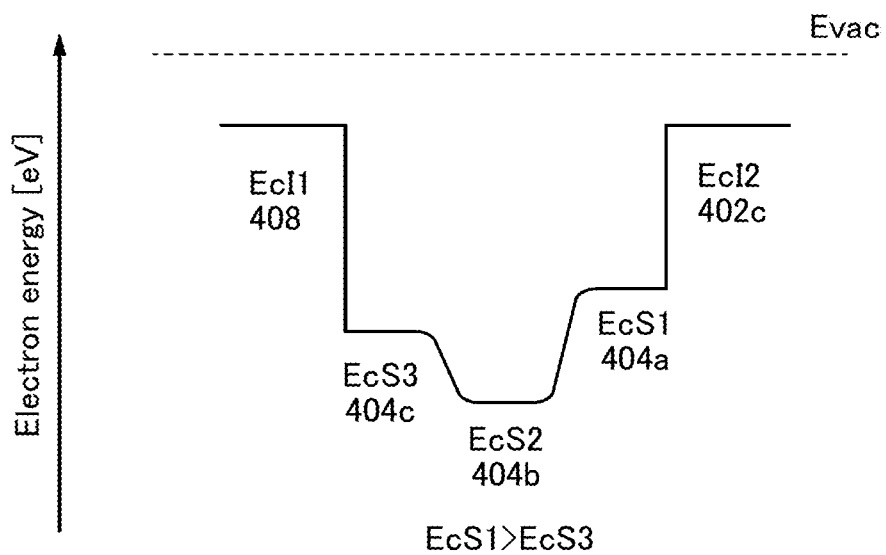

According to FIGS. 12A and 12B, the oxide semiconductor layer 404b of the multilayer semiconductor layer 404 serves as a well, so that a channel is formed in the oxide semiconductor layer 404b in a transistor including the multilayer semiconductor layer 404. Note that since the conduction band minimum continuously varies, the multilayer semiconductor layer 404 can also be referred to as a U-shaped well. Further, a channel formed to have such a structure can also be referred to as a buried channel.

Note that trap states due to impurities or defects might be formed in the vicinity of the interface between the oxide semiconductor layers 404a and 404c and an insulating layer such as a silicon oxide layer. The oxide semiconductor layer 404b can be distanced away from the trap states owing to existence of the oxide semiconductor layer 404a and the oxide semiconductor layer 404c. However, when the energy difference between EcS2 and EcS1 or between EcS2 and EcS3 is small, an electron in the oxide semiconductor layer 404b might reach the trap states by passing over the oxide semiconductor layer 404a or the oxide semiconductor layer 404c. When electrons serving as negative fixed charges are trapped in the trap states, the threshold voltage of the transistor shifts in the positive direction.

Thus, to reduce a variation in the threshold voltage of the transistor, energy differences between EcS2 and each of EcS1 and EcS3 are necessary. Each of the energy differences is preferably greater than or equal to 0.1 eV, further preferably greater than or equal to 0.15 eV.

The oxide semiconductor layer 404a, the oxide semiconductor layer 404b, and the oxide semiconductor layer 404c preferably include crystal parts. In particular, when a crystal in which c-axes are aligned is used, the transistor can have stable electrical characteristics.

In the case where an In—Ga—Zn oxide is used for the multilayer semiconductor layer 404, it is preferable that the oxide semiconductor layer 404c contain less In than the oxide semiconductor layer 404b so that diffusion of In to the gate insulating layer is prevented.

For the source electrode 406a and the drain electrode 406b, a conductive material that can be bonded to oxygen is preferably used. For example, Al, Cr, Cu, Ta, Ti, Mo, or W can be used. Among the materials, in particular, it is preferable to use Ti which is easily bonded to oxygen or to use W with a high melting point, which allows subsequent process temperatures to be relatively high. Note that the conductive material that can be bonded to oxygen includes, in its category, a material to which oxygen is easily diffused.

When the conductive material that can be bonded to oxygen is in contact with a multilayer semiconductor layer, a phenomenon occurs in which oxygen in the multilayer semiconductor layer is diffused to the conductive material that can be bonded to oxygen. The phenomenon noticeably occurs when the temperature is high. Since the fabricating process of the transistor involves some heat treatment steps, the above phenomenon causes generation of oxygen vacancies in the vicinity of a region which is in the multilayer semiconductor layer and is in contact with the source electrode or the drain electrode. The oxygen vacancies bond to hydrogen that is slightly contained in the layer, whereby the region is changed to an n-type region. Thus, the n-type region can serve as a source or a drain of the transistor.

In the case of forming a transistor with an extremely short channel length, an n-type region which is formed by the generation of oxygen vacancies might extend in the channel length direction of the transistor, causing a short circuit. In that case, the electrical characteristics of the transistor change; for example, the threshold voltage shifts to cause a state in which it is difficult to control on and off states of the transistor with the gate voltage (conduction state). Accordingly, when a transistor with an extremely short channel length is formed, it is not always preferable that a conductive material that can be bonded to oxygen be used for a source electrode and a drain electrode.

In such a case, a conductive material which is less likely to be bonded to oxygen than the above material is preferably used for the source electrode 406a and the drain electrode 406b. As the conductive material which is not easily bonded to oxygen, for example, a material containing tantalum nitride, titanium nitride, or ruthenium or the like can be used.

Note that in the case where the conductive material is in contact with the oxide semiconductor layer 404b, the conductive materials may be stacked with the above-described conductive material which is easily bonded to oxygen.

The first insulating layer 408a can be formed using an insulating layer containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The thickness of the first insulating layer 408a is more than or equal to 1 nm and less than or equal to 20 nm, preferably more than or equal to 5 nm and less than or equal to 15 nm.

The second insulating layer 408b can be formed using an insulating layer containing one or more of hafnium oxide, aluminum oxide, aluminum silicate, and the like. The thickness of the second insulating layer 408b is more than or equal to 5 nm and less than or equal to 30 nm, preferably more than or equal to 10 nm and less than or equal to 25 nm.

The third insulating layer 408c can be formed using an insulating layer containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The thickness of the third insulating layer 408c is more than or equal to 1 nm and less than or equal to 25 nm, preferably more than or equal to 5 nm and less than or equal to 20 nm.

For the gate electrode 410, a conductive layer formed using Al, Ti, Cr, Co, Ni, Cu, Y, Zr, Mo, Ru, Ag, Ta, W, or the like can be used. The gate electrode 410 may be a stack including any of the above materials. Alternatively, a conductive layer containing nitrogen may be used for the gate electrode 410. For example, the gate electrode 410 can be a stack in which a tungsten layer is formed over a titanium nitride layer, a stack in which a tungsten layer is formed over a tungsten nitride layer, or a stack in which a tungsten layer is formed over a tantalum nitride layer.

The oxide insulating layer 412 may be formed over the gate insulating layer 408 and the gate electrode 410. The oxide insulating layer 412 can be formed using an insulating layer containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide. The oxide insulating layer 412 may be a stack including any of the above materials.

Here, the oxide insulating layer 412 preferably contains excess oxygen. An oxide insulating layer containing excess oxygen refers to an oxide insulating layer from which oxygen can be released by heat treatment or the like. The oxide insulating layer containing excess oxygen is preferably a layer in which the amount of released oxygen when converted into oxygen atoms is $1.0\times10^{19}$ atoms/cm$^3$ or more in thermal desorption spectroscopy analysis. Note that the temperature of the oxide insulating layer surface in the thermal desorption spectroscopy analysis is preferably higher than or equal to 100° C. and lower than or equal to 700° C., or higher than or equal to 100° C. and lower than or equal to 500° C. Oxygen released from the oxide insulating layer can be diffused to the channel formation region in the multilayer semiconductor layer 404 through the gate insulating layer 408, so that oxygen vacancies formed in the channel formation region can be filled with the oxygen. In this manner, stable electrical characteristics of the transistor can be achieved.

High integration of a semiconductor device requires miniaturization of a transistor. However, it is known that miniaturization of a transistor causes deterioration of the electrical characteristics of the transistor. When a channel width is shortened, an on-state current is decreased.

However, in the transistor of this embodiment, as described above, the oxide semiconductor layer 404c is formed so as to cover a region where a channel is formed in the oxide semiconductor layer 404b, and a channel formation layer and the gate insulating layer are not in contact with each other. Accordingly, scattering of carriers at the interface between a channel formation layer and the gate insulating layer can be reduced and the on-state current of the transistor can be increased.

When the oxide semiconductor layer is formed to be intrinsic or substantially intrinsic, the field-effect mobility might be reduced because of a decrease in the number of carriers contained in the oxide semiconductor layer. However, in the transistor of this embodiment, a gate electric field is applied to the oxide semiconductor layer in the side surface direction in addition to the perpendicular direction. That is, the gate electric field is applied to the whole of the oxide semiconductor layer, whereby current flows in the bulk of the oxide semiconductor layer. Consequently, a change in the electrical characteristics can be suppressed owing to the highly purified intrinsic oxide semiconductor layer and the field-effect mobility of the transistor can be increased.

In the transistor of this embodiment, the oxide semiconductor layer 404b is formed over the oxide semiconductor layer 404a, so that an interface state is less likely to be formed. In addition, impurities do not enter the oxide semiconductor layer 404b from above and below because the oxide semiconductor layer 404b is an intermediate layer in a three-layer structure. With the structure in which the oxide semiconductor layer 404b is surrounded by the oxide semiconductor layer 404a and the oxide semiconductor layer 404c (or the oxide semiconductor layer 404b is electrically surrounded by the gate electrode 410), on-state current of the transistor is increased as described above, and in addition, threshold voltage can be stabilized and an S value can be reduced. Thus, the source-drain current when the potential of the gate electrode 103 is 0 V can be reduced and power consumption can be reduced. Furthermore, the threshold voltage of the transistor becomes stable; thus, long-term reliability of the semiconductor device can be improved.

Figure 13A:
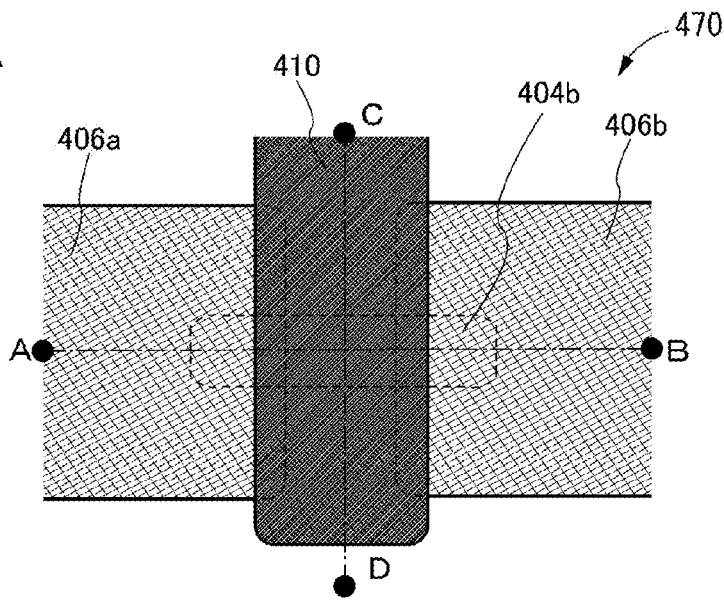
FIGS. 13A to 13C are a top view and cross-sectional views illustrating a transistor.
Figure 13B:
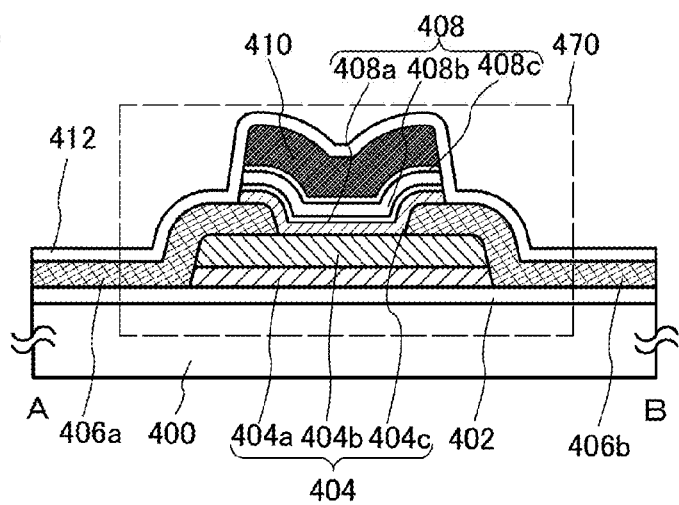
Figure 13C:
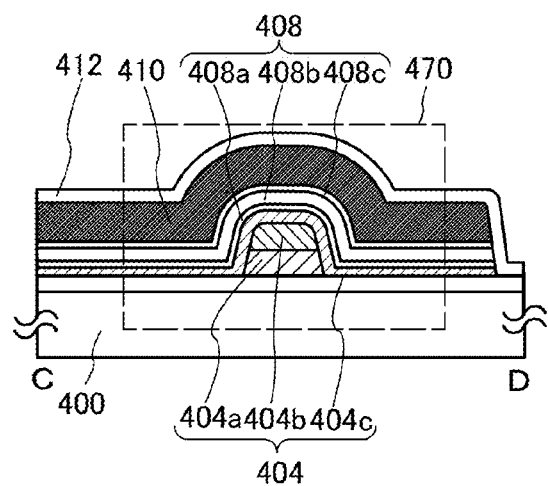

A transistor 470 illustrated in FIGS. 13A to 13C can be used. FIGS. 13A to 13C are a top view and cross-sectional views which illustrate the transistor 470. FIG. 13A is the top view. FIG. 13B illustrates a cross section taken along dashed-dotted line A-B in FIG. 13A. FIG. 13C illustrates a cross section taken along dashed-dotted line C-D in FIG. 13A. Note that for simplification of the drawing, some components are not illustrated in the top view in FIG. 13A.

In the transistor 470, the base insulating layer 402 has no depression and projection because overetching of the base insulating layer 402 does not occur when the oxide semiconductor layer 404a and the oxide semiconductor layer 404b are formed.

To prevent the base insulating layer 402 from being etched by overetching, the etching selectivity of the base insulating layer 402 is preferably set lower than the etching selectivity of the oxide semiconductor layer.

In this embodiment, although the oxide semiconductor layer 404b is sandwiched between the oxide semiconductor layer 404a and the oxide semiconductor layer 404c, without limited to this structure, one embodiment of the present invention may have a structure in which only the oxide semiconductor layer 404b is provided without the oxide semiconductor layer 404a and the oxide semiconductor layer 404c and is electrically covered with the gate electrode.

This embodiment can be combined with any of the other embodiments in this specification as appropriate.

Embodiment 3

In this embodiment, a method for forming the transistor 450, which is described in Embodiment 2 with reference to FIGS. 11A to 11C, is described with reference to FIGS. 14A to 14C and FIGS. 15A to 15C.

As the substrate 400, a glass substrate, a ceramic substrate, a quartz substrate, a sapphire substrate, or the like can be used. Alternatively, a single crystal semiconductor substrate or a polycrystalline semiconductor substrate of silicon or silicon carbide, a compound semiconductor substrate of silicon germanium, a silicon-on-insulator (SOI) substrate, or the like can be used. Still alternatively, any of these substrates provided with a semiconductor element may be used. When a silicon substrate is used, a thermal oxidation film may be formed on the substrate surface.

Figure 14A:
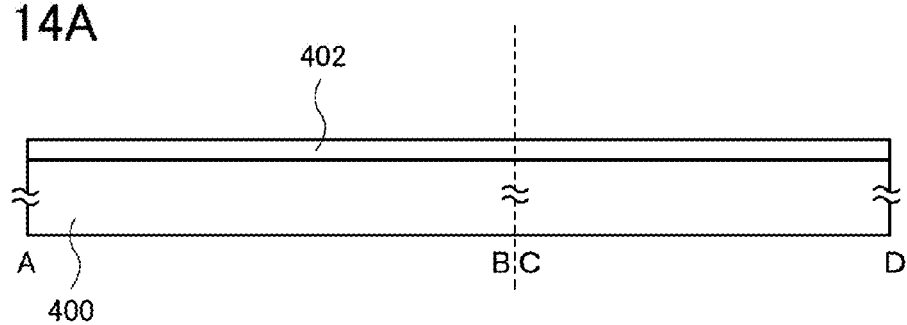
FIGS. 14A to 14C illustrate a method for manufacturing a transistor.

First, the base insulating layer 402 is formed over the substrate 400 (see FIG. 14A).

Oxygen may be added to the base insulating layer 402 by an ion implantation method, an ion doping method, a plasma immersion ion implantation method, or the like. Addition of oxygen enables the base insulating layer 402 to supply oxygen much easily to the multilayer semiconductor layer 404.

Figure 14B:
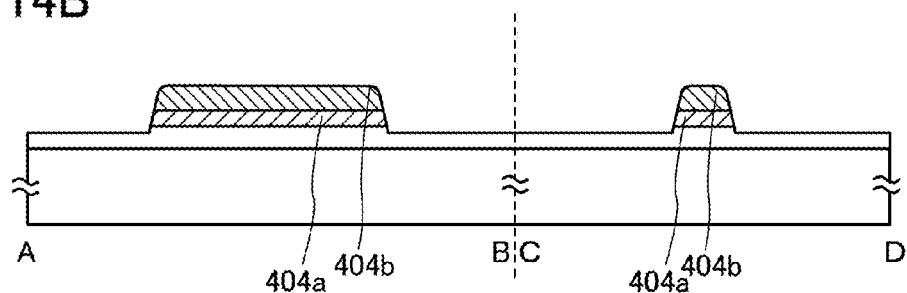

Next, the oxide semiconductor layer 404a and the oxide semiconductor layer 404b are formed over the base insulating layer 402 by a sputtering method; a chemical vapor deposition (CVD) method such as a metal organic chemical vapor deposition (MOCVD) method, an atomic layer deposition (ALD) method, or a plasma-enhanced CVD (PECVD) method; a vacuum evaporation method; or a pulse laser deposition (PLD) method (see FIG. 14B). At this time, as illustrated, the base insulating layer 402 may be slightly over-etched. By over-etching of the base insulating layer 402, the gate electrode 410 to be formed later can cover the oxide semiconductor layer 404c easily.

For processing the oxide semiconductor layer 404a and the oxide semiconductor layer 404b into island shapes, a layer to be a hard mask (e.g., a tungsten layer) and a resist mask are provided over the oxide semiconductor layer 404b, and the layer to be a hard mask is etched to form a hard mask. The resist mask is removed and then the oxide semiconductor layer 404a and the oxide semiconductor layer 404b are etched using the hard mask as a mask. Then, the hard mask is removed. At this step, the edges of the hard mask are gradually reduced as the etching progresses; as a result, the edges of the hard mask are rounded to have a curved surface. Accordingly, the edges of the oxide semiconductor layer 404b are rounded to have a curved surface. This structure improves the coverage with the oxide semiconductor layer 404c, the gate insulating layer 408, the gate electrode 410, and the oxide insulating layer 412, which are to be formed over the oxide semiconductor layer 404b, and can prevent shape defects such as disconnection. In addition, electric field concentration which might occur at end portions of the source electrode 406a and the drain electrode 406b can be reduced, which can reduce deterioration of the transistor.

In order to form a continuous junction in stacked layers including the oxide semiconductor layers 404a and 404b, or stacked layers also including the oxide semiconductor layer 404c to be formed in a later step, the layers need to be formed successively without exposure to the air with the use of a multi-chamber deposition apparatus (e.g., a sputtering apparatus) including a load lock chamber. It is preferable that each chamber of the sputtering apparatus be able to be evacuated to a high vacuum (approximately $5 \times 10^{-7}$ Pa to $1 \times 10^{-4}$ Pa) by an adsorption vacuum evacuation pump such as a cryopump and that the chamber be able to heat a substrate over which a film is to be deposited to 100° C. or higher, preferably 500° C. or higher, so that water and the like acting as impurities of an oxide semiconductor are removed as much as possible. Alternatively, a combination of a turbo molecular pump and a cold trap is preferably used to prevent back-flow of a gas containing a carbon component, moisture, or the like from an exhaust system into a chamber. Moreover, it is effective to place a quadrupole mass analyzer (also referred to as Q-mass) in the apparatus to monitor whether leakage occurs in the chamber.

Not only high vacuum evacuation in a chamber but also increasing the purity of a sputtering gas is necessary to obtain a high-purity intrinsic oxide semiconductor. As an oxygen gas or an argon gas used for a sputtering gas, a gas which is highly purified to have a dew point of −40° C. or lower, preferably −80° C. or lower, further preferably −100° C. or lower is used, whereby entry of moisture or the like into the oxide semiconductor layer can be prevented as much as possible.

The materials described in Embodiment 2 can be used for the oxide semiconductor layer 404a, the oxide semiconductor layer 404b, and the oxide semiconductor layer 404c that is to be formed in a later step. For example, an In—Ga—Zn oxide whose atomic ratio of In to Ga and Zn is 1:3:4 or 1:3:2 can be used for the oxide semiconductor layer 404a, an In—Ga—Zn oxide whose atomic ratio of In to Ga and Zn is 1:1:1 can be used for the oxide semiconductor layer 404b, and an In—Ga—Zn oxide whose atomic ratio of In to Ga and Zn is 1:3:4 or 1:3:2 can be used for the oxide semiconductor layer 404c.

An oxide that can be used for each of the oxide semiconductor layers 404a, 404b, and 404c preferably contains at least indium (In) or zinc (Zn). Both In and Zn are preferably contained. Furthermore, in order to reduce variations in electrical characteristics of the transistors including the oxide semiconductor, the oxide preferably contains a stabilizer in addition to In and Zn.

As a stabilizer, gallium (Ga), tin (Sn), hafnium (Hf), aluminum (Al), zirconium (Zr), and the like are used. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide, In—Zn oxide, Sn—Zn oxide, Al—Zn oxide, Zn—Mg oxide, Sn—Mg oxide, In—Mg oxide, In—Ga oxide, In—Ga—Zn oxide, In—Al—Zn oxide, In—Sn—Zn oxide, Sn—Ga—Zn oxide, Al—Ga—Zn oxide, Sn—Al—Zn oxide, In—Hf—Zn oxide, In—La—Zn oxide, In—Ce—Zn oxide, In—Pr—Zn oxide, In—Nd—Zn oxide, In—Sm—Zn oxide, In—Eu—Zn oxide, In—Gd—Zn oxide, In—Tb—Zn oxide, In—Dy—Zn oxide, In—Ho—Zn oxide, In—Er—Zn oxide, In—Tm—Zn oxide, In—Yb—Zn oxide, In—Lu—Zn oxide, In—Sn—

Ga—Zn oxide, In—Hf—Ga—Zn oxide, In—Al—Ga—Zn oxide, In—Sn—Al—Zn oxide, In—Sn—Hf—Zn oxide, or In—Hf—Al—Zn oxide.

For example, "In—Ga—Zn oxide" means an oxide containing In, Ga, and Zn as its main components. The In—Ga—Zn oxide may contain another metal element in addition to In, Ga, and Zn. Note that in this specification, a layer containing the In—Ga—Zn oxide is also referred to as an IGZO layer.

A material represented by $InMO_3(ZnO)_m$ (m>0 is satisfied, and m is not an integer) may be used. Note that M represents one or more metal elements selected from Ga, Fe, Mn, or Co. A material represented by $In_2SnO_5(ZnO)_n$ (n>0, n is an integer) may be used.

Note that as described in Embodiment 2 in detail, materials are selected so that the oxide semiconductor layers 404a and 404c each have an electron affinity lower than that of the oxide semiconductor layer 404b.

Note that the oxide semiconductor layer is preferably formed by a sputtering method. As a sputtering method, an RF sputtering method, a DC sputtering method, an AC sputtering method, or the like can be used. In particular, a DC sputtering method is preferably used because dust generated in the film formation can be reduced and the thickness can be uniform.

When In—Ga—Zn oxide is used for the oxide semiconductor layers 404a, 404b, and 404c, a material whose atomic ratio of In to Ga and Zn is any of 1:1:1, 2:2:1, 3:1:2, 1:3:2, 1:3:4, 1:4:3, 1:5:4, 1:6:6, 2:1:3 1:6:4, 1:9:6, 1:1:4, and 1:1:2 is used so that the oxide semiconductor layers 404a and 404c each have an electron affinity lower than that of the oxide semiconductor layer 404b.

Note that the expression "the composition of an oxide including In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$ ($(a-A)^2+(b-B)^2+(c-C)^2$ is less than or equal to $r^2$), and r may be 0.05, for example. The same applies to other oxides.

The indium content in the oxide semiconductor layer 404b is preferably higher than those in the oxide semiconductor layers 404a and 404c. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher mobility than an oxide having a composition in which the proportion of In is equal to or lower than that of Ga. Thus, with use of an oxide having a high indium content for the oxide semiconductor layer 404b, a transistor having high mobility can be achieved.

Here, a structure of an oxide semiconductor will be described.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 22A:
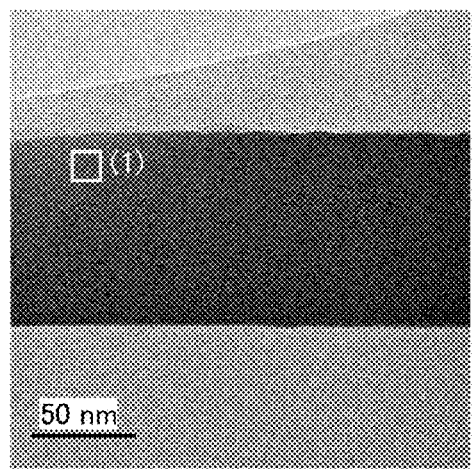
FIGS. 22A to 22D are Cs-corrected high-resolution TEM images of a cross section of a CAAC-OS and a cross-sectional schematic view of a CAAC-OS.

A CAAC-OS observed with TEM is described below. FIG. 22A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 22B:
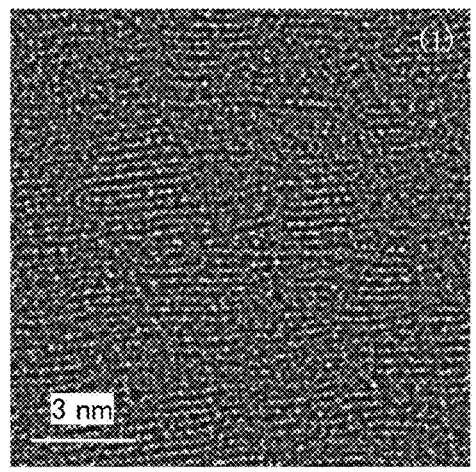

FIG. 22B is an enlarged Cs-corrected high-resolution TEM image of a region (1) in FIG. 22A. FIG. 22B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 22C:
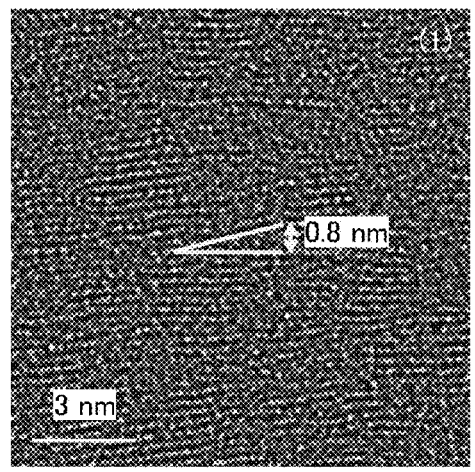

As shown in FIG. 22B, the CAAC-OS has a characteristic atomic arrangement. The characteristic atomic arrangement is denoted by an auxiliary line in FIG. 22C. FIGS. 22B and 22C prove that the size of a pellet is greater than or equal to 1 nm, or greater than or equal to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 22D:
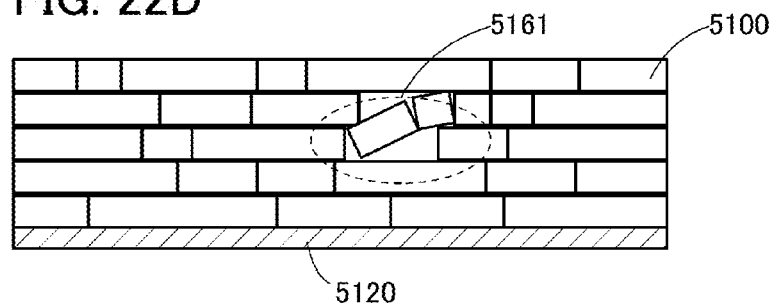

Here, according to the Cs-corrected high-resolution TEM images, the schematic arrangement of pellets 5100 of a CAAC-OS over a substrate 5120 is illustrated by such a structure in which bricks or blocks are stacked (see FIG. 22D). The part in which the pellets are tilted as observed in FIG. 22C corresponds to a region 5161 shown in FIG. 22D.

FIG. 23A shows a Cs-corrected high-resolution TEM image of a plane of the CAAC-OS observed from a direction substantially perpendicular to the sample surface. FIGS. 23B, 23C, and 23D are enlarged Cs-corrected high-resolution TEM images of regions (1), (2), and (3) in FIG. 23A, respectively. FIGS. 23B, 23C, and 23D indicate that metal atoms are arranged in a triangular, quadrangular, or hexagonal configuration in a pellet. However, there is no regularity of arrangement of metal atoms between different pellets.

Figure 24A:
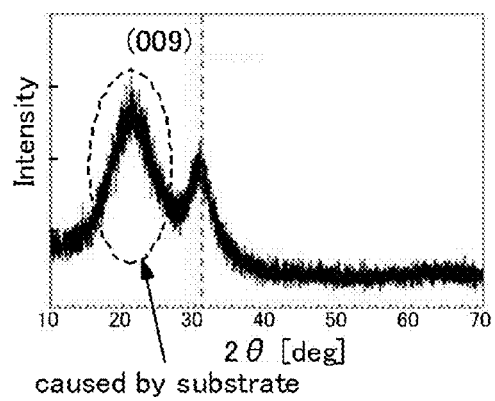
FIGS. 24A to 24C show structure analysis of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 24A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 24B:
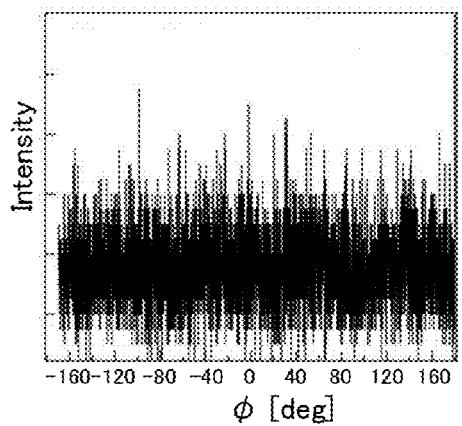
Figure 24C:
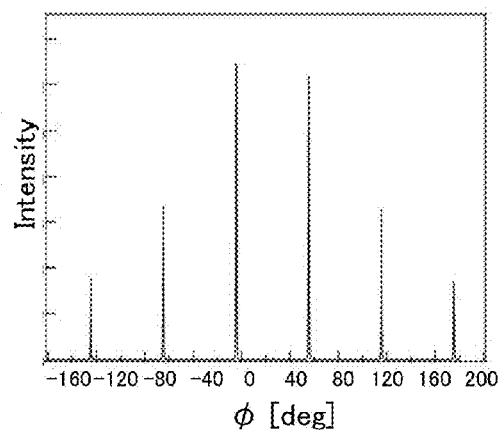

On the other hand, in structural analysis of the CAAC-OS by an in-plane method in which an X-ray beam is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 24B, a peak is not clearly observed. In contrast, in the case of a single crystal oxide semiconductor of InGaZnO$_4$, when φ scan is performed with 2θ fixed at around 56°, as shown in FIG. 24C, six peaks which are derived from crystal planes equivalent to the (110) plane are observed. Accordingly, the structural analysis using XRD shows that the directions of a-axes and b-axes are irregularly oriented in the CAAC-OS.

Figure 25A:
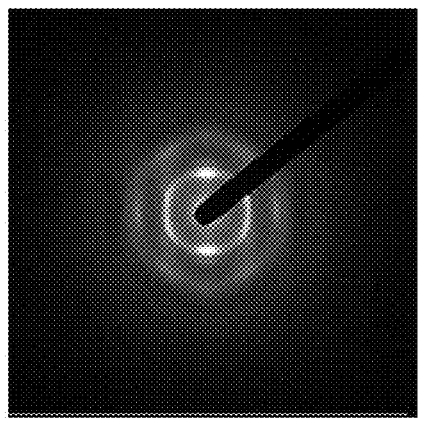
FIGS. 25A and 25B show electron diffraction patterns of a CAAC-OS.
Figure 25B:
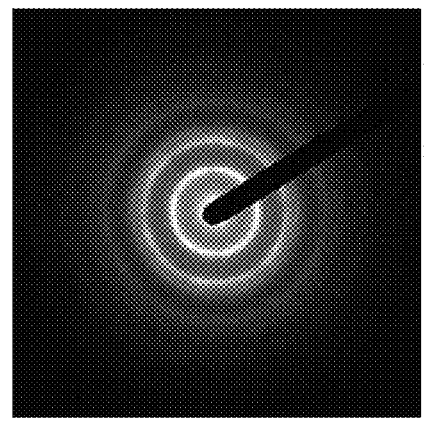

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 25A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 25B shows a diffraction pattern obtained in such a manner that an electron beam with a probe diameter of 300 nm is incident on the same sample in a direction perpendicular to the sample surface. As shown in FIG. 25B, a ring-like diffraction pattern is observed. Thus, the electron diffraction also indicates that the a-axes and b-axes of the pellets included in the CAAC-OS do not have regular alignment. The first ring in FIG. 25B is considered to be derived from the (010) plane, the (100) plane, and the like of the InGaZnO$_4$ crystal. The second ring in FIG. 25B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 26:
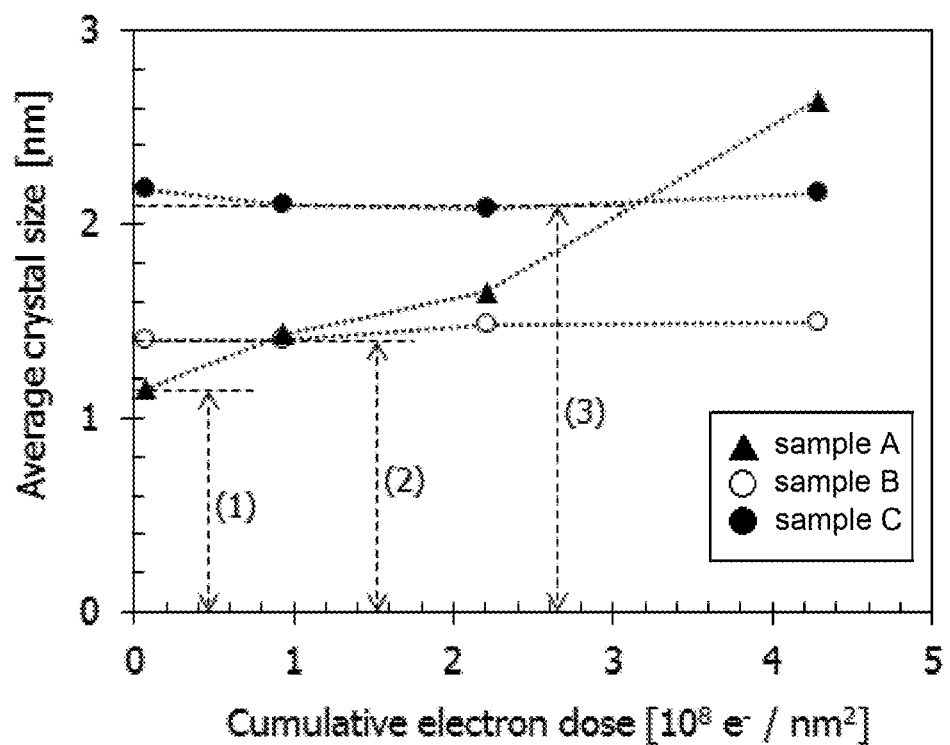
FIG. 26 shows a change of crystal parts of an In—Ga—Zn oxide owing to electron irradiation.

FIG. 26 shows change in the average size of crystal parts (at 22 points to 45 points) in each sample. Note that the crystal part size corresponds to the length of a lattice fringe. FIG. 26 indicates that the crystal part size in the a-like OS increases with an increase in the cumulative electron dose. Specifically, as shown by (1) in FIG. 26, a crystal part of approximately 1.2 nm (also referred to as an initial nucleus) at the start of TEM observation grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. Specifically, as shown by (2) and (3) in FIG. 26, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

For example, the CAAC-OS layer can be deposited by a sputtering method using a polycrystalline oxide semiconductor sputtering target. When ions collide with the sputtering target, a crystal region included in the sputtering target is sometimes separated from the target along an a-b plane; in other words, a sputtered particle having a plane parallel to an a-b plane (flat-plate-like sputtered particle or pellet-like sputtered particle) flakes off from the sputtering target. The flat-plate-like or pellet-like sputtered particle is electrically charged and thus reaches the substrate while maintaining its crystal state, without being aggregation in plasma, forming a CAAC-OS layer.

First heat treatment may be performed after the oxide semiconductor layer 404b is formed. The first heat treatment may be performed at a temperature higher than or equal to 250° C. and lower than or equal to 650° C., typically higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor layer 404b can be improved, and in addition, impurities such as hydrogen and water can be removed from the base insulating layer 402 and the oxide semiconductor layer 404a. Note that the first heat treatment may be performed before etching for formation of the oxide semiconductor layer 404b.

A first conductive layer to be the source electrode 406a and the drain electrode 406b is formed over the oxide semiconductor layers 404a and 404b. For the first conductive layer, Al, Cr, Cu, Ta, Ti, Mo, W, or an alloy material containing any of these as a main component can be used. For example, a 100-nm-thick titanium layer is formed by a sputtering method or the like. Alternatively, a tungsten layer may be formed by a CVD method.

Figure 14C:
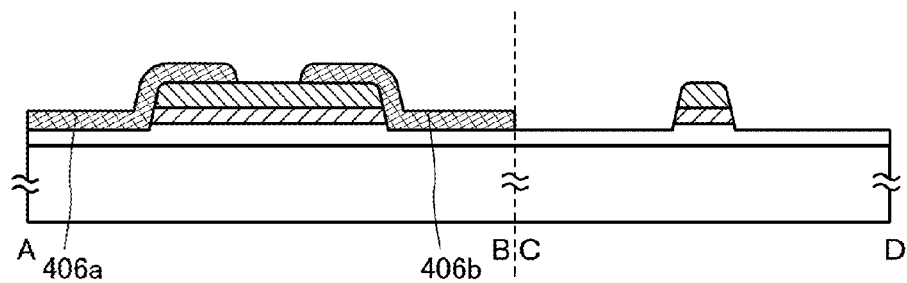

Then, the first conductive layer is etched so as to be divided over the oxide semiconductor layer 404b, so that the source electrode 406a and the drain electrode 406b are formed (see FIG. 14C).

Next, the oxide semiconductor layer 403c is formed over the oxide semiconductor layer 404b, the source electrode 406a, and the drain electrode 406b.

Note that second heat treatment may be performed after the oxide semiconductor layer 403c is formed. The second heat treatment can be performed under conditions similar to those of the first heat treatment. The second heat treatment can remove impurities such as hydrogen and water from the oxide semiconductor layer 403c. In addition, impurities such as hydrogen and water can be further removed from the oxide semiconductor layer 404a and 404b.

Figure 15A:
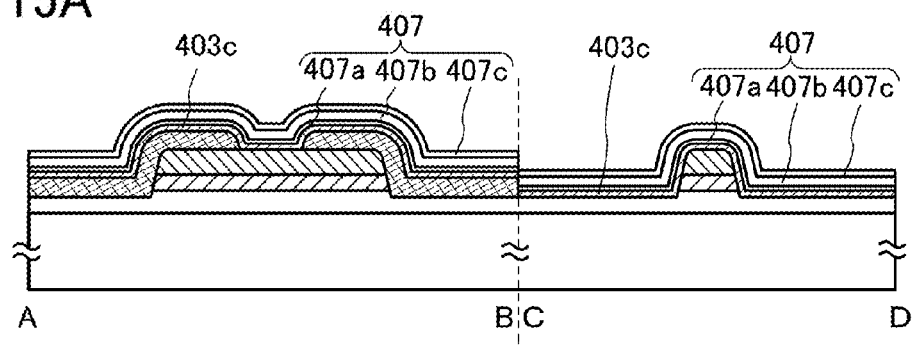
FIGS. 15A to 15C illustrate a method for manufacturing a transistor.

Next, an insulating layer 407 to be the gate insulating layer 408 is formed over the oxide semiconductor layer 403c (see FIG. 15A). The insulating layer 407 includes an insulating layer 407a, an insulating layer 407b, and an insulating layer 407c. The insulating layer 407a can be formed using a material containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide. The insulating layer 407b can be formed using a material containing one or more of hafnium oxide, aluminum oxide, tantalum oxide, aluminum silicate, silicon nitride, and the like, for example. The insulating layer 407c can be formed using a material containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide.

The insulating layers 407a, 407b, and 407c can be formed by a sputtering method, a chemical vapor deposition (CVD) method such as a metal organic chemical vapor deposition (MOCVD) method, an atomic layer deposition (ALD) method, or a plasma-enhanced CVD (PECVD) method, a vacuum evaporation method, a pulse laser deposition (PLD) method, and the like. The insulating layers 407a and 407c may be formed by a PECVD method and the insulating layer 407b may be formed by an ALD method.

Figure 15B:
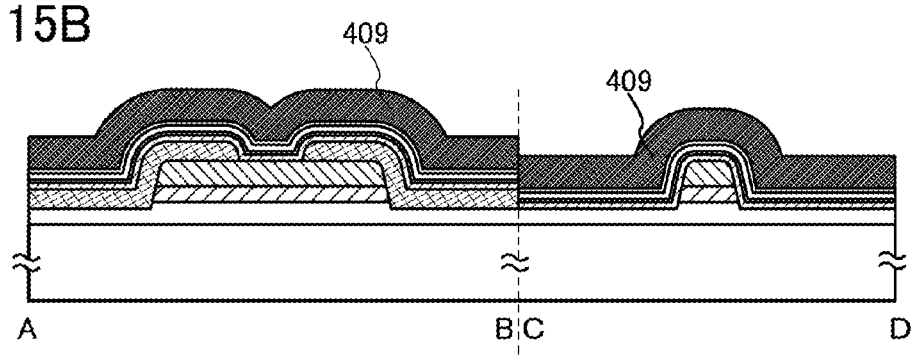

Then, a second conductive layer 409 to be the gate electrode 410 is formed over the insulating layer 407 (see FIG. 15B). For the second conductive layer 409, Al, Ti, Cr, Co, Ni, Cu, Y, Zr, Mo, Ru, Ag, Ta, W, or an alloy material containing any of these as its main component can be used. The second conductive layer 409 can be formed by a sputtering method, a CVD method, or the like. A stack including a conductive layer containing any of the above materials and a conductive layer containing nitrogen, or a conductive layer containing nitrogen may be used for the second conductive layer 409.

Figure 15C:
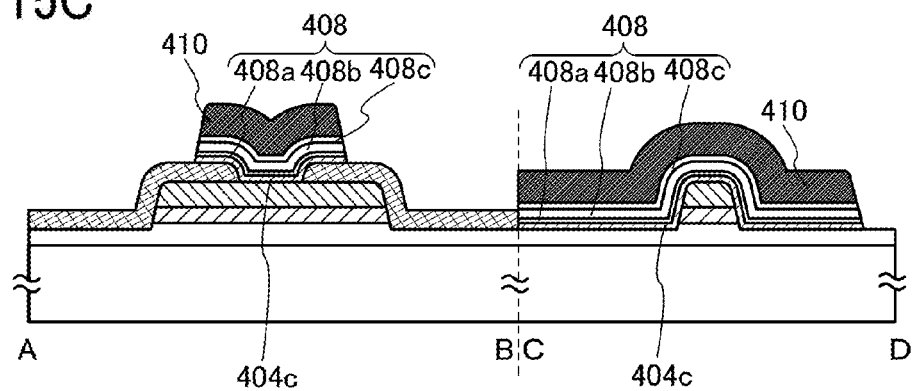

Next, the second conductive layer 409 is selectively etched using a resist mask to form the gate electrode 410 (see FIG. 15C). Note that as shown in FIG. 11C, the oxide semiconductor layer 404b is surrounded by the gate electrode 410.

Then, the insulating layer 407 is selectively etched using the resist mask or the gate electrode 410 as a mask to form the gate insulating layer 408.

Then, the oxide semiconductor layer 403c is etched using the resist mask or the gate electrode 410 as a mask to form the oxide semiconductor layer 404c.

The upper edge of the oxide semiconductor layer 404c is aligned with the bottom edge of the gate insulating layer 408. The upper edge of the gate insulating layer 408 is aligned with the bottom edge of the gate electrode 410. Although the gate insulating layer 408 and the oxide semiconductor layer 404c are formed using the gate electrode 410 as a mask, the gate insulating layer 408 and the oxide semiconductor layer 404c may be formed before the second conductive layer 409 is formed.

Next, the oxide insulating layer 412 is formed over the source electrode 406a, the drain electrode 406b, and the gate electrode 410 (see FIGS. 11B and 11C). A material and a method for the oxide insulating layer 412 can be similar to those for the base insulating layer 402. The oxide insulating layer 412 may be formed using an aluminum oxide, a magnesium oxide, a silicon oxide, a silicon nitride, a gallium oxide, a germanium oxide, an yttrium oxide, a zirconium oxide, a lanthanum oxide, a neodymium oxide, a hafnium oxide, a tantalum oxide, or the like. Alternatively, an oxide containing nitrogen, such as a silicon oxynitride and a silicon nitride oxide may be used. The oxide insulating layer 412 may be a stack including any of the above materials. The oxide insulating layer 412 can be formed by a sputtering method, a chemical vapor deposition (CVD) method such as a metal organic chemical vapor deposition (MOCVD) method, an atomic layer deposition (ALD) method, or a plasma-enhanced CVD (PECVD) method, a vacuum evaporation method, or a pulse laser deposition (PLD) method. The oxide insulating layer 412 preferably contains excessive oxygen so as to be able to supply oxygen to the multilayer semiconductor layer 404.

Next, third heat treatment may be performed. The third heat treatment can be performed under conditions similar to those of the first heat treatment. By the third heat treatment, excess oxygen is easily released from the base insulating layer 402, the gate insulating layer 408, and the oxide insulating layer 412, so that oxygen vacancies in the multilayer layer 404 can be reduced.

Next, an insulating layer 413 is formed over the oxide insulating layer 412 (see FIGS. 11B and 11C). The insulating layer 413 can be formed using an organic insulating film of an acrylic resin, polyimide, an epoxy resin, a siloxane polymer, or the like. Furthermore, the surface of the insulating layer 413 may be planarized by a CMP method or the like.

Then, the threshold voltage adjustment process is performed. Through the threshold voltage adjustment process, a state where the potential of the gate electrode 410 is higher than those of the source electrode and the drain electrode by +10 V or more is held for 5 s or shorter, typically 1 s or shorter. Accordingly, the needed number of electrons moves from the multilayer semiconductor layer 404 to the gate electrode 410, and some of the electrons are trapped in the second insulating layer 408b or the electron trap states at the interface between the second insulating layer 408b and the first insulating layer 408a or the third insulating layer 408c. This electron trap makes the threshold voltage adjusted in the positive direction.

Through the above process, the transistor 450 illustrated in FIGS. 11A to 11C can be fabricated.

This embodiment can be implemented in combination with any of the other embodiments disclosed in this specification as appropriate.

Embodiment 4

In this embodiment, an inverter using the transistor described in Embodiment 2 will be described.

Figure 16A:
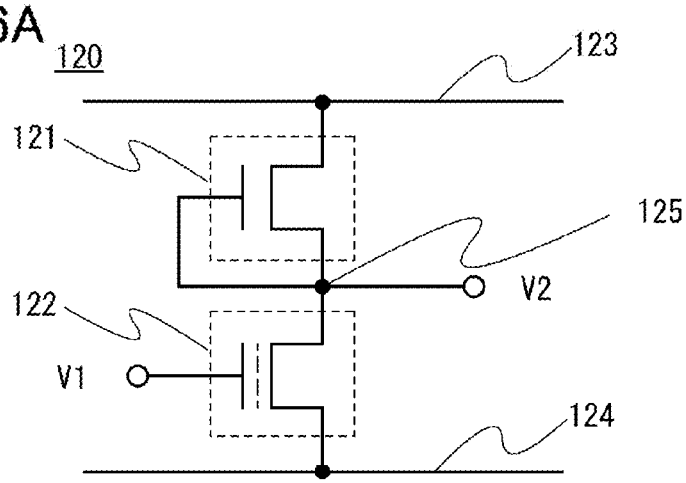
FIGS. 16A to 16C are a circuit diagram, a top view, and a cross-sectional view that illustrate a semiconductor device, respectively.
Figure 16B:
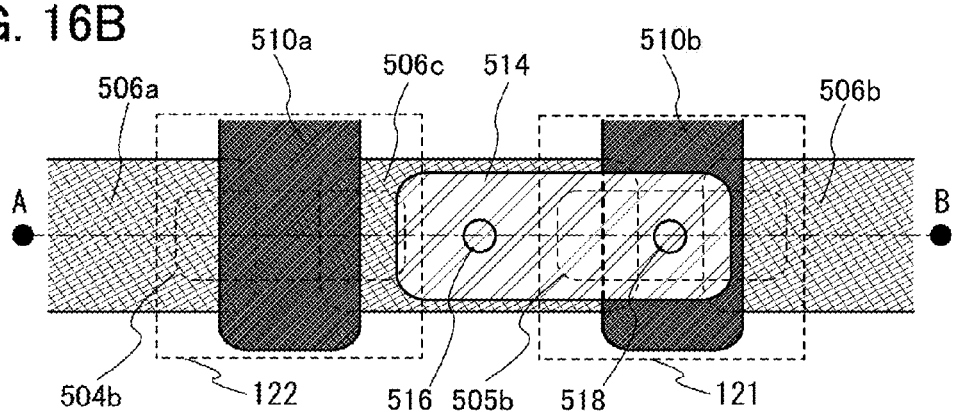
Figure 16C:
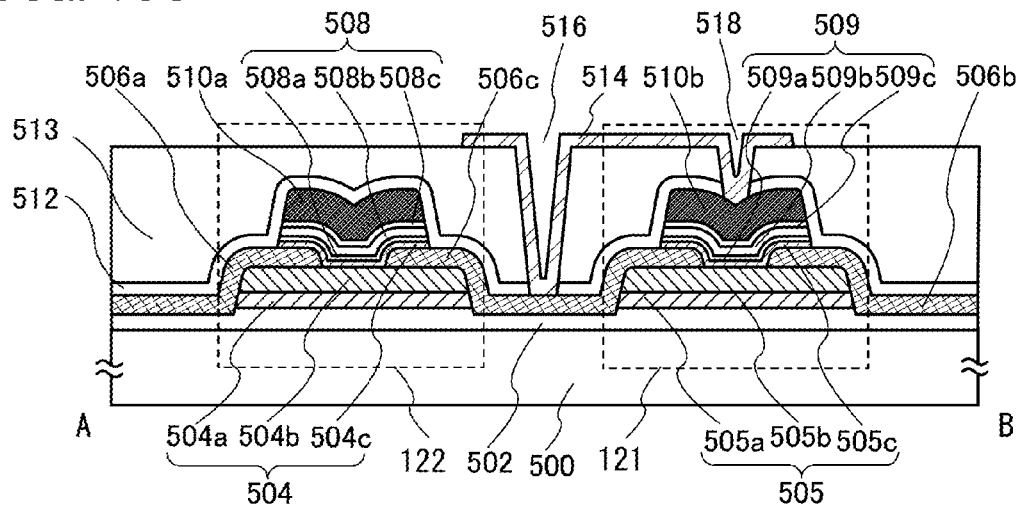

FIG. 16A is a circuit diagram of the inverter circuit 120 described in Embodiment 1, and FIGS. 16B and 16C are a top view and a cross-sectional view illustrating the inverter circuit 120 of one embodiment disclosed in this specification. FIG. 16B is a top view, and a cross section along dashed-dotted line A-B in FIG. 16B is illustrated in FIG. 16C. Note that for simplification of the drawing, some components in FIG. 16B are not illustrated. In some cases, the direction of the dashed-dotted line A-B is referred to as a channel length direction, and the direction perpendicular to that of the dashed-dotted line A-B is referred to as a channel width direction.

The inverter circuit 120 in FIG. 16A includes the transistors 121 and 122. The transistor 121 is electrically connected to the power supply line 123 that supplies a high potential, and the transistor 122 is electrically connected to the power supply line 124 that supplies a low potential. The transistor 121 and the transistor 122 are connected to each other at the node 125, and the gate of the transistor 121 is connected to the node 125. When a signal is input to the input terminal V1 of the inverter circuit 120, the signal is output from the output terminal V2. Here, the transistor 121 is a depletion-mode transistor and the transistor 122 is an enhancement-mode transistor.

Next, the structures of the transistors 121 and 122 are described with reference to the top view and the cross-sectional view of the transistors illustrated in FIGS. 16B and 16C. The transistor 122 includes a base insulating layer 502 over a substrate 500, an oxide semiconductor layer 504a and an oxide semiconductor layer 504b over the base insulating layer 502, a source electrode 506a and a drain electrode 506c over the oxide semiconductor layer 504a and the oxide semiconductor layer 504b, an oxide semiconductor layer 504c in contact with the oxide semiconductor layer 504b, the source electrode 506a, and the drain electrode 506c, a gate insulating layer 508 over the oxide semiconductor layer 504c, a gate electrode 510a over the gate insulating layer 508, an oxide insulating layer 512 over the source electrode 506a, the drain electrode 506c, and the gate electrode 510a, and a planarization film 513 over the oxide insulating layer 512. The transistor 121 includes the base insulating layer 502 over the substrate 500, an oxide semiconductor layer 505a and an oxide semiconductor layer 505b over the base insulating layer 502, a source electrode 506b and the drain electrode 506c over the oxide semiconductor layer 505a and the oxide semiconductor layer 505b, an oxide semiconductor layer 505c in contact with the oxide semiconductor layer 505b, the source electrode 506b, and the drain electrode 506c, a gate insulating layer 509 (corresponding to the charge trap layer 102 in FIG. 1C) over the oxide semiconductor layer 505c, a gate electrode 510b (corresponding to the gate electrode 103 in FIG. 1C) over the gate insulating layer 509, the oxide insulating layer 512 over the source electrode 506b, the drain electrode 506c, and the gate electrode 510b, and the planarization film 513 over the oxide insulating layer 512.

The gate electrode 510b of the transistor 121 is electrically connected to the drain electrode 506c of the transistor 121 through a wiring 514 in a contact hole 516 and a contact hole 518. Thus, the gate electrode 510b of the transistor 121 is also electrically connected to the drain electrode 506c of the transistor 122.

Although the common drain electrode 506c is used as the drain electrode of the transistor 121 and the drain electrode of the transistor 122, the present invention is not limited thereto, and electrodes may be formed separately and connected to each other with a wiring. The electrodes are electrically connected to each other.

The gate insulating layer 508 and the gate insulating layer 509 each serve as the charge trap layer described in Embodiment 1. Thus, first insulating layers 508a and 509a (corresponding to the first insulating layer 102a in FIG. 1C), second insulating layers 508b and 509b (corresponding to the second insulating layer 102b in FIG. 1C), and third insulating layers 508c and 509c (corresponding to the third insulating layer 102c in FIG. 1C) are included in the gate insulating layers. In addition, multilayer semiconductor layers 504 and 505 includes the oxide semiconductor layers 504a and 505a, and the oxide semiconductor layers 504b and 505b, and the oxide semiconductor layers 504c and 505c. The multilayer semiconductor layers 504 and 505 correspond to the semiconductor layer 101 in FIG. 1C.

The transistors 121 and 122 each are formed to be a depletion-mode transistor. Then, a state where the potential of the gate electrode 510a of the transistor 122 is higher than those of the source electrode 506a and the drain electrode 506c by +10 V or more is held for 5 s or shorter, typically 1 s or shorter, whereby a process through which electrons are trapped in the gate insulating layer 508 is performed. Consequently, the threshold voltage of the transistor 122 shifts in the positive direction, and the transistor 122 can become an enhancement-mode transistor. In contrast, a potential with which the threshold voltage is changed is not applied to the transistor 121; thus, electrons are not trapped in the gate insulating layer 509, and the threshold voltage of the transistor 121 is not changed. That is, the transistor 121 can be used as the depletion-mode transistor. In this manner, the depletion-mode transistor and the enhancement-mode transistor can be separately formed without separately forming the structures of the transistor. Thus, the processes can be reduced and time and cost can also be reduced.

The potential applied to the gate electrode 510a to trap electrons in the gate insulating layer 508 is preferably higher than the potential in normal use as an inverter. Then, the trapped electrons are less likely to move in normal use.

Figure 17A:
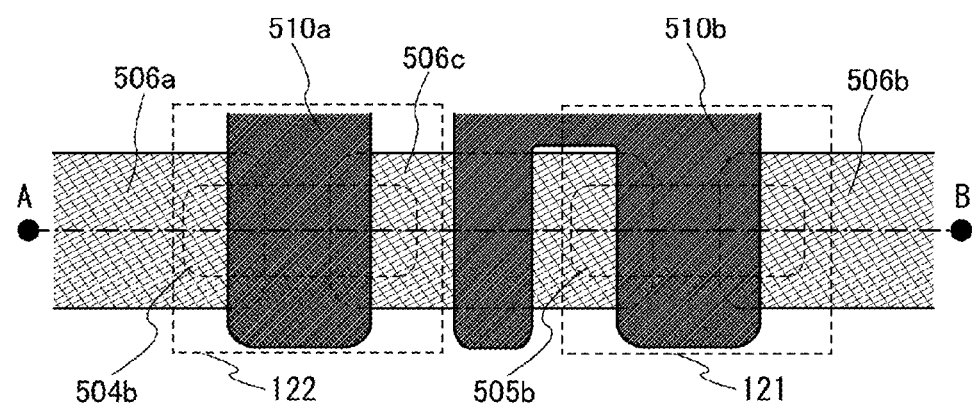
FIGS. 17A and 17B are a top view and a cross-sectional view illustrating a semiconductor device.
Figure 17B:
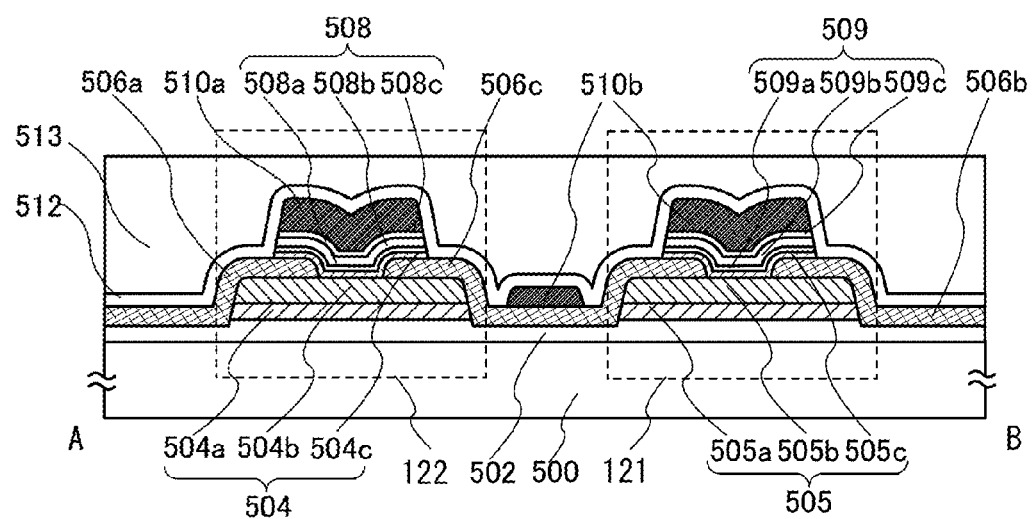

Alternatively, an inverter having a structure illustrated in FIGS. 17A and 17B can be used. FIGS. 17A and 17B are a top view and a cross-sectional view illustrating the transistor 122 and the transistor 121 included in an inverter. FIG. 17A is a top view, and a cross section taken along dashed-dotted line A-B in FIG. 17A is illustrated in FIG. 17B. Note that for simplification of the drawing, some components in FIG. 17A are not illustrated.

Here, instead of forming a wiring 514 in FIGS. 16B and 16C, the gate electrode 510b of the transistor 121 is formed so that the gate electrode 510b is directly connected to the drain electrode 506c. Thus, the wiring 514 is not needed and the process can be simplified.

The transistor having the above-described structure can be used not only in the inverter circuit 120 in FIG. 16A, but also in the inverter circuit 127 in FIG. 4B described in Embodiment 1. For example, in the structure of FIGS. 16B and 16C, the gate electrode 510b and the source electrode 506b of the transistor 121 may be connected to each other with the wiring 514. Alternatively, in the structure of FIGS. 17A and 17B, the gate electrode 510b may be in contact with the source electrode 506b in the transistor 121.

Although this embodiment has a structure in which the oxide semiconductor layer 504b (or 505b) is sandwiched between the oxide semiconductor layers 504a and 504c (or 505a and 505c), without limitation to this structure, a structure including only the oxide semiconductor layer 504b and not including the oxide semiconductor layers 504a and 504c is possible. Alternatively, one embodiment of the present invention may have a structure in which any one or two of the oxide semiconductor layer 504a, the oxide semiconductor layer 504b, and the oxide semiconductor layer 504c is/are provided.

This embodiment can be combined with any of the other embodiments in this specification as appropriate.

Embodiment 5

The above-described semiconductor device can be used for display devices, laptops, or image reproducing devices provided with recording media (typically devices which reproduce the content of recording media such as DVDs (digital versatile disc) and have displays for displaying the reproduced images). Other than the above, as an electronic apparatuses which can use the semiconductor device according to an embodiment of the present invention, mobile phones, portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. Specific examples of such electronic apparatuses are shown in FIGS. 18A to 18F.

Figure 18A:
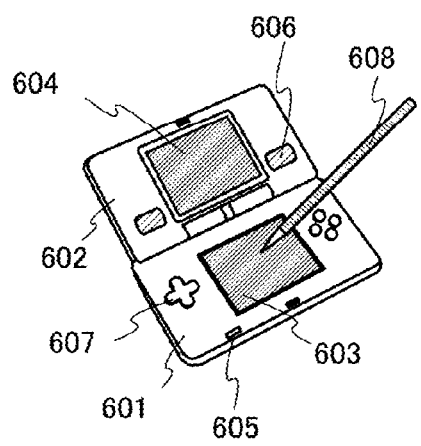
FIGS. 18A to 18F illustrate examples of an electronic device.

FIG. 18A illustrates a portable game machine including a housing 601, a housing 602, a display portion 603, a display portion 604, a microphone 605, a speaker 606, an operation key 607, a stylus 608, and the like. Although the portable game machine in FIG. 18A has the two display portions 603 and 604, the number of display portions included in a portable game machine is not limited to this.

Figure 18B:
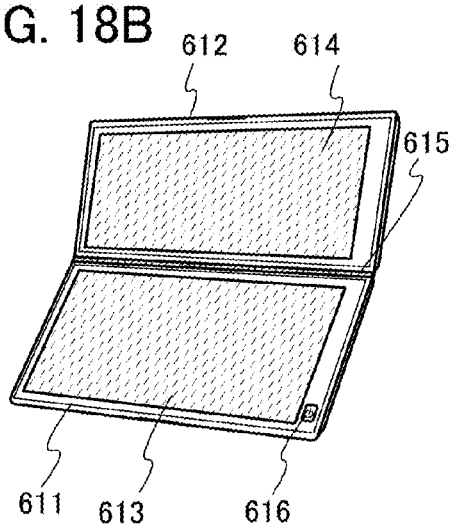

FIG. 18B illustrates a portable data terminal including a first housing 611, a second housing 612, a first display portion 613, a second display portion 614, a joint 615, an operation key 616, and the like. The first display portion 613 is provided in the first housing 611, and the second display portion 614 is provided in the second housing 612. The first housing 611 and the second housing 612 are connected to each other with the joint 615, and the angle between the first housing 611 and the second housing 612 can be changed with the joint 615. An image on the first display portion 613 may be switched depending on the angle between the first housing 611 and the second housing 612 at the joint 615. A display device with a position input function may be used as at least one of the first display portion 613 and the second display portion 614. Note that the position input function can be added by provision of a touch panel in a display device. Alternatively, the position input function can be added by provision of a photoelectric conversion element called a photosensor in a pixel area of a display device.

Figure 18C:
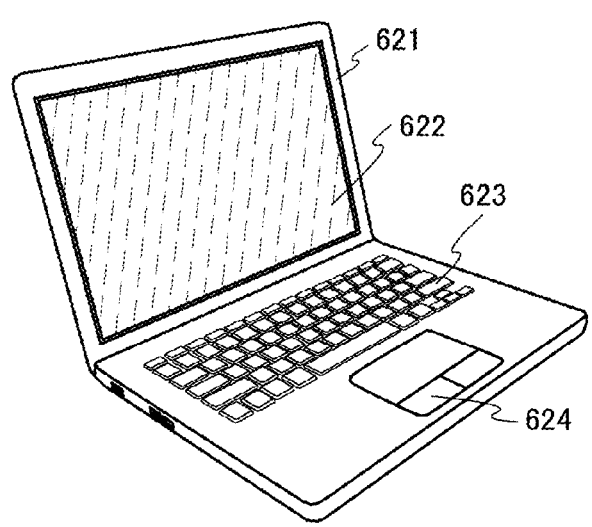

FIG. 18C illustrates a laptop personal computer, which includes a housing 621, a display portion 622, a keyboard 623, a pointing device 624, and the like.

Figure 18D:
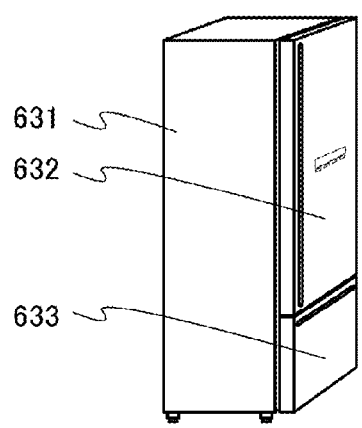

FIG. 18D illustrates the electric refrigerator-freezer including a housing 631, a door for a refrigerator 632, a door for a freezer 633, and the like.

Figure 18E:
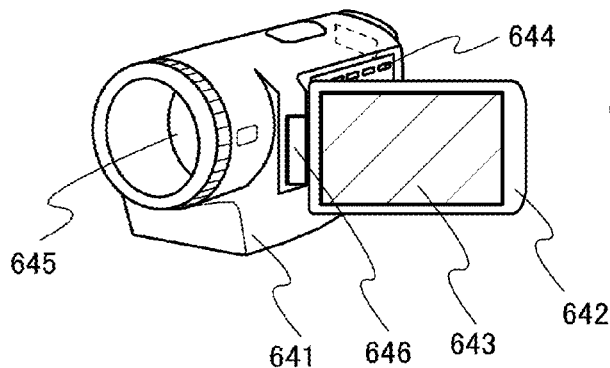

FIG. 18E illustrates a video camera, which includes a first housing 641, a second housing 642, a display portion 643, operation keys 644, a lens 645, a joint 646, and the like. The operation keys 644 and the lens 645 are provided for the first housing 641, and the display portion 643 is provided for the second housing 642. The first housing 641 and the second housing 642 are connected to each other with the joint 646, and the angle between the first housing 641 and the second housing 642 can be changed with the joint 646. Images displayed on the display portion 643 may be switched in accordance with the angle at the joint 646 between the first housing 641 and the second housing 642.

Figure 18F:
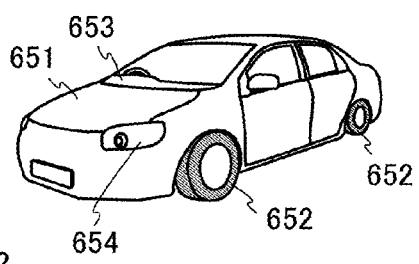

FIG. 18F illustrates a passenger car including a car body 651, wheels 652, a dashboard 653, lights 654, and the like.

This embodiment can be combined with any of the other embodiments disclosed in this specification as appropriate.

Example

In this example, transistors having the same structure as the transistor 450 illustrated in FIGS. 11A to 11C were fabricated as samples of this example, and electrical characteristics were measured.

First of all, a method for fabricating the samples of this example will be described.

First, a thermal oxide film was formed to a thickness of 100 nm on a silicon substrate, and a silicon oxynitride (SiON) film to be a base insulating film was formed to a thickness of 300 nm on the thermal oxide film. The silicon oxynitride film was deposited by a PECVD method under the following conditions: silane ($SiH_4$) at a flow rate of 2.3 sccm and dinitrogen monoxide ($N_2O$) at a flow rate of 800 sccm were used as source gases; pressure in a reaction chamber was 40 Pa; substrate temperature was 400° C.; and an RF power source of 50 W was supplied to parallel plate electrodes with a 27.12 MHz high frequency power source.

Then, the silicon oxynitride film was planarized by a CMP method and first heat treatment was performed. The heat treatment was performed under a reduced-pressure atmosphere at 450° C. for one hour. After that, oxygen ions were implanted into the silicon oxynitride film with an ion implantation apparatus under the following conditions: an acceleration voltage of 60 kV and a dosage of $2.0 \times 10^{16}$ atoms/cm$^2$.

Next, a 20-nm-thick first oxide semiconductor film and a 15-nm-thick second oxide semiconductor film were stacked. The first oxide semiconductor film was deposited by a sputtering method using an oxide target of In:Ga:Zn=1:3:4 (atomic ratio) under the following conditions: mixed atmosphere of argon and oxygen (argon:oxygen=40 sccm:5 sccm); pressure, 0.4 Pa; power supply, 0.5 kW; distance between the substrate and the target, 60 mm; and substrate temperature, 200° C. The second oxide semiconductor film was deposited by a sputtering method using an oxide target of In:Ga:Zn=1:1:1 (atomic ratio) under the following conditions: mixed atmosphere of argon and oxygen (argon: oxygen=30 sccm:15 sccm); pressure, 0.4 Pa; power supply, 0.5 kW; distance between the substrate and the target, 60 mm; and substrate temperature, 300° C. Note that the first oxide semiconductor film and the second oxide semiconductor film were successively deposited without exposure to the air.

Then, second heat treatment was performed. The heat treatment was performed under a nitrogen atmosphere at 450° C. for one hour, and then performed under an oxygen atmosphere at 450° C. for one hour.

Then, the first oxide semiconductor film and the second oxide semiconductor film were processed into an island shape by inductively coupled plasma (ICP) etching under the following conditions: atmosphere of boron trichloride ($BCl_3$=80 sccm); power supply, 450 W; bias power, 100 W; and pressure, 1.2 Pa.

Next, a tungsten film to be a source electrode and a drain electrode was deposited to a thickness of 100 nm on the first oxide semiconductor film and the second oxide semiconductor film. The tungsten film was deposited by a sputtering method using a tungsten target under the following conditions: argon (Ar=80 sccm) atmosphere; pressure, 0.8 Pa; power supply (power supply output), 1.0 kW; distance between the silicon substrate and the target, 60 mm; and substrate target temperature, 230° C.

Next, a resist mask was formed over the tungsten film and etching was performed by an ICP etching method. As the etching, first etching, second etching, and third etching were performed. The conditions of the first etching were as follows: mixed atmosphere of carbon tetrafluoride, chlorine, and oxygen ($CF_4$:$Cl_2$:$O_2$=55 sccm: 45 sccm: 55 sccm); power supply, 3000 W; bias power, 110 W; and pressure, 0.67 Pa. The second etching was performed after the first etching under the following conditions: oxygen atmosphere ($O_2$=100 sccm); power supply, 2000 W; bias power, 0 W; and pressure, 3.0 Pa. The third etching was performed after the second etching under the following conditions: mixed atmosphere of carbon tetrafluoride, chlorine, and oxygen ($CF_4$:$Cl_2$:$O_2$=55 sccm: 45 sccm: 55 sccm); power supply, 3000 W; bias power, 110 W; and pressure, 0.67 Pa. Thus, the source electrode and the drain electrode were formed.

Next, a third oxide semiconductor film was deposited to a thickness of 5 nm on the second oxide semiconductor film, the source electrode, and the drain electrode. The third oxide semiconductor film was deposited by a sputtering method using an oxide target of In:Ga:Zn=1:3:2 (atomic ratio) under the following conditions: mixed atmosphere of argon and oxygen (argon:oxygen=30 sccm: 15 sccm); pressure, 0.4 Pa; power supply, 0.5 kW; distance between the target and the substrate, 60 mm; and substrate temperature, 200° C.

Next, a silicon oxynitride film to be a gate insulating layer was deposited to a thickness of 5 nm by a CVD method under the following conditions: a mixed atmosphere of silane and dinitrogen monoxide ($SiH_4$:$N_2O$=1 sccm: 800 sccm); a pressure of 200 Pa, power supply of 150 W; a distance between the target and the substrate of 28 mm; and a substrate temperature of 350° C. Then, a hafnium oxide film serving as a gate insulating layer was deposited to a thickness of 20 nm on the silicon oxynitride film by an ALD method. The hafnium oxide film was deposited using two kinds of gases, i.e., ozone ($O_3$) as an oxidizer and a source material gas that is obtained by vaporizing a liquid containing a solvent and a hafnium precursor compound (hafnium alkoxide or hafnium amide such as tetrakis(dimethylamide) hafnium (TDMAH)) at a substrate temperature of 200° C.

In addition, a silicon oxynitride film to be a gate insulating layer was deposited to a thickness of 15 nm by a CVD method under the following conditions: a mixed atmosphere of silane and dinitrogen monoxide ($SiH_4$:$N_2O$=1 sccm: 800 sccm); a pressure of 200 Pa, power supply of 150 W; a distance between the target and the substrate of 28 mm; and a substrate temperature of 350° C.

Next, third heat treatment was performed. The heat treatment was performed under an oxygen atmosphere at 490° C. for one hour.

Next, a tantalum nitride film was deposited to a thickness of 30 nm and a tungsten film was deposited to a thickness of 135 nm by a sputtering method. The deposition conditions of the tantalum nitride film by a sputtering method were as follows: mixed atmosphere of argon and nitrogen (argon:nitrogen=50 sccm: 10 sccm); pressure, 0.6 Pa; power supply, 1 kW; distance between the target and the substrate, 60 mm; and substrate temperature, 25° C. The deposition conditions of the tungsten film by a sputtering method were as follows: an argon (Ar=100 sccm) atmosphere; pressure, 2.0 Pa; power supply, 4 kW; distance between the target and the substrate, 60 mm; and substrate target temperature, 230° C.

Then, the stack of the 30-nm-thick tantalum nitride film and the 135-nm-thick tungsten film was etched by an ICP etching method. As the etching, first etching and second etching were performed. The conditions of the first etching were as follows: mixed atmosphere of chlorine, carbon tetrafluoride, and oxygen ($Cl_2$:$CF_4$:$O_2$=45 sccm: 55 sccm: 55 sccm); power supply, 3000 W; bias power, 110 W; and pressure, 0.67 Pa. The second etching was performed after the first etching under the following conditions: a chlorine ($Cl_2$=100 sccm) atmosphere; power supply, 2000 W; bias power, 50 W; and pressure, 0.67 Pa. Thus, a gate electrode was formed.

Then, a stack of the gate insulating layers and the third oxide semiconductor film was etched using a mask. The etching was performed under the following conditions: a boron trichloride ($BCl_3$=80 sccm) atmosphere; power supply, 450 W; bias power, 100 W; and pressure, 1.0 Pa.

Next, an aluminum oxide film was deposited to a thickness of 70 nm on the gate electrode by a sputtering method, and fourth heat treatment was performed. The heat treatment was performed under an oxygen atmosphere at 400° C. for one hour.

Next, a silicon oxynitride film was deposited to a thickness of 300 nm by a CVD method.

Through the above steps, the transistors were fabricated.

Figure 19A:
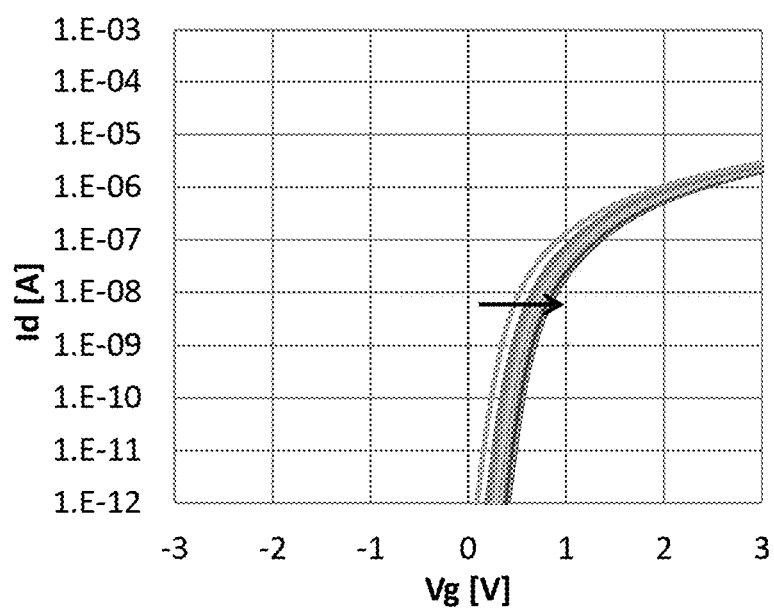
FIGS. 19A and 19B show measurement results of electrical characteristics of transistors manufactured in Example.
Figure 19B:
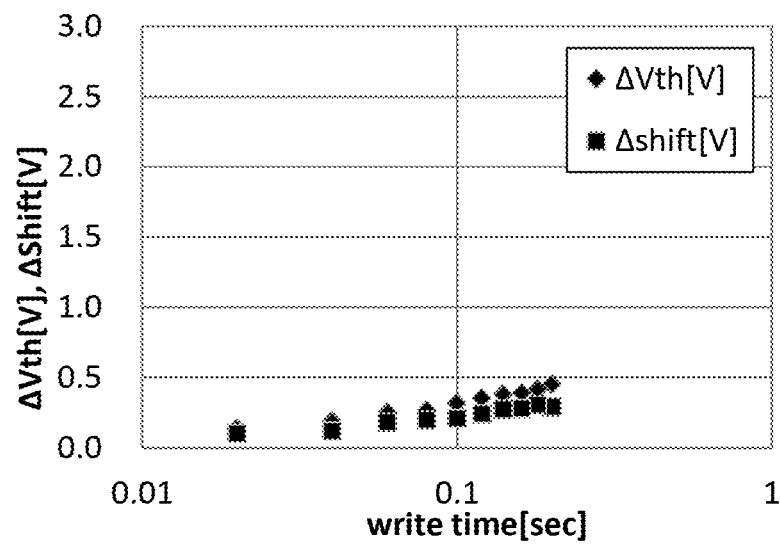

Next, threshold voltage adjustment process was performed on the fabricated transistors. The threshold voltage adjustment process was performed under the conditions that the source voltage (Vs: [V]) and the drain voltage (Vd: [V]) were set to 0V and a gate voltage of +10 V was applied at room temperature. The length of time during which the potential was applied was varied from 0 ms, 20 ms, 40 ms, 60 ms, 80 ms, 100 ms, 120 ms, 140 ms, 160 ms, 180 ms, and 200 ms, and Id-Vg of the transistors on which the threshold voltage adjustment process was performed was measured. The measurement results of the transistors in this example are shown in FIGS. 19A and 19B. In addition, the measurement results of the transistors in this example in the case where the gate voltage in the threshold voltage adjustment process was +20 V are shown in FIGS. 20A and 20B.

Figure 20A:
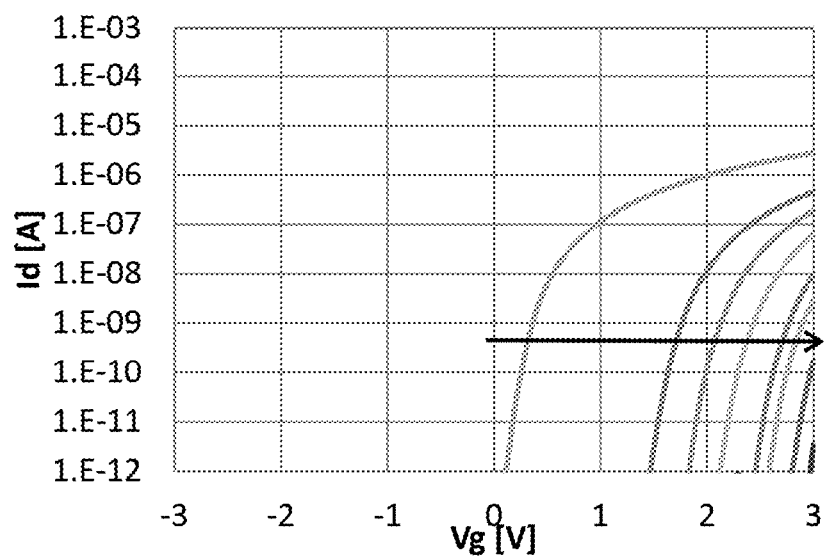
FIGS. 20A and 20B show measurement results of electrical characteristics of transistors manufactured in Example.

FIG. 19A and FIG. 20A show the measurement results at drain voltages (Vd: [V]) of 1.8 V, where the horizontal axis represents a gate voltage (Vg: [V]) and the vertical axis represents a drain current (Id: [A]). Note that "drain voltage (Vd: [V])" refers to a potential difference between a drain and a source when the potential of the source is used as a reference potential, and "gate voltage (Vg: [V])" refers to a potential difference between a gate and a source when the potential of the source is used as a reference potential. The plural solid lines in the graphs indicate the Id-Vg measurement results of the transistors under the conditions that the length of time during which the threshold voltage adjustment process was performed (threshold voltage adjustment time) was varied from 0 ms, 20 ms, 40 ms, 60 ms, 80 ms, 100 ms, 120 ms, 140 ms, 160 ms, 180 ms, and 200 ms. The electrical characteristics shown on the line segment side of the arrow represent electrical characteristics when the threshold voltage adjustment time was 0 ms, and the electrical characteristics shown on the triangle vertex side of the arrow represent electrical characteristics when the threshold voltage adjustment time was 200 ms.

Figure 20B:
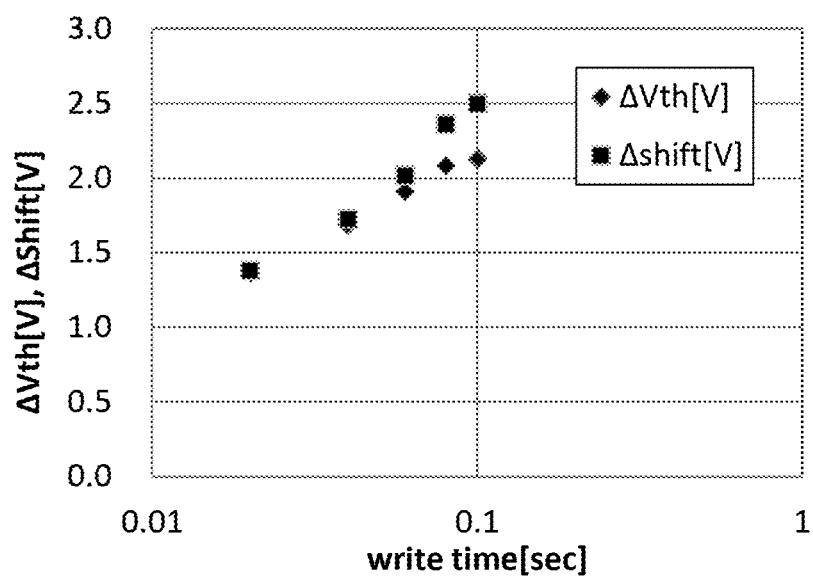

FIG. 19B and FIG. 20B show graphs in which variations in threshold voltage ΔVth and variations in shift value (value of gate voltage at the time when drain current rises) Δshift that were obtained from the measurement results shown in FIG. 19A and FIG. 20A are plotted on the vertical axis, and the threshold voltage adjustment time is plotted on the horizontal axis.

The threshold voltage Vth is defined, in a graph where the horizontal axis and the vertical axis indicate the gate voltage (Vg [V]) and the square root of drain current ($Id^{1/2}$) respectively, as a point of intersection of the extrapolated tangent line of $Id^{1/2}$ having the highest inclination with the Vg axis. The shift value is defined, in a graph where the horizontal axis and the vertical axis indicate the gate voltage (Vg [V]) and the logarithm of drain current respectively, as a point of intersection of the extrapolated tangent line of Id having the highest inclination and the axis Id ($Id=1.0\times10^{-12}$ [A]).

As is seen from FIGS. 19A and 19B and FIGS. 20A and 20B, as the gate voltage applied at the time of the threshold voltage adjustment process is larger, the threshold voltage shifts in the positive direction, even when the threshold voltage adjustment time is the same. Furthermore, as the threshold voltage adjustment time is longer, the threshold voltage shifts in the positive direction, even when the gate voltage applied at the time of the threshold voltage adjustment process is the same.

Figure 21A:
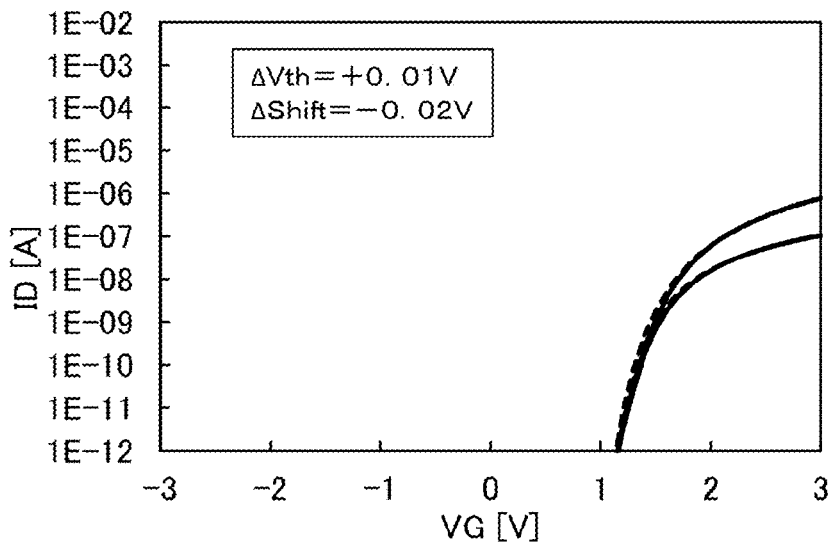
FIGS. 21A and 21B show results of stress tests performed on transistors manufactured in Example.
Figure 21B:
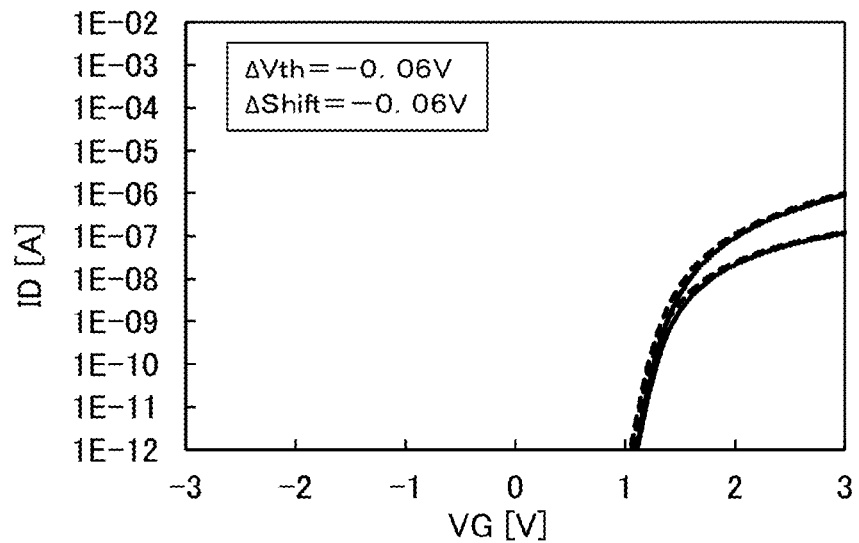

Moreover, on the transistors fabricated in this example and on which the threshold voltage adjustment process was performed, a gate bias temperature (+GBT) stress test and a drain bias temperature (+DBT) stress test were performed, and the electrical characteristics before and after the test were measured. The conditions for the threshold voltage adjustment process were as follows: Vs=Vd=0 V, room temperature, Vg=+11 V, and time for applying voltage of 50 ms. The conditions for the +GBT stress test were as follows: 150° C., 1 hour, a source voltage and drain voltage of 0 V, and a gate voltage Vtg of +3.0 V. The conditions for the +DBT stress test were as follows: 150° C., 1 hour, a source voltage and drain voltage of 1.8 V, and a gate voltage of 0 V. The drain current (Id: [A]) was measured before and after each stress test under the following conditions: 40° C., Vd of +0.1 V or +1.8 V, a source voltage of 0 V, and a gate voltage of −3.0 V to +3.0 V for every 0.1 V. FIG. 21A shows electrical characteristics before and after the +GBT stress test. FIG. 21B shows electrical characteristics before and after the +DBT stress test.

As shown in FIG. 21A, a variation in threshold voltage ΔVth and a variation in shift value Δshift before and after the +GBT stress test performed on the transistor fabricated in this example were 0.01 V and −0.02 V, respectively. As shown in FIG. 21B, a variation in threshold voltage ΔVth and a variation in shift value Δshift before and after the +DBT stress test performed on the transistor fabricated in this example were both −0.06 V. These results show that the threshold voltage and the shift value hardly change after each of the stress tests, that is, the threshold voltage of the transistor on which the threshold voltage adjustment process was performed hardly changes.

As described above, electrons trapped in a charge trap layer of a transistor on which the threshold voltage adjustment process is performed do not move from the charge trap layer even under stress conditions, and the adjusted threshold voltage can be stably kept.

This application is based on Japanese Patent Application serial no. 2014-111390 filed with Japan Patent Office on May 29, 2014, the entire contents of which are hereby incorporated by reference.

What is claimed is:

1. A semiconductor device comprising:
   a first transistor; and
   a second transistor,
   wherein the first transistor comprises:
      a first oxide semiconductor;
      a first electrode over the first oxide semiconductor, the first electrode being electrically connected to the first oxide semiconductor;
      a first charge trap layer over the first oxide semiconductor and the first electrode; and
      a first gate electrode over the first charge trap layer, the first gate electrode overlapping the first oxide semiconductor,
   wherein the second transistor comprises:
      a second oxide semiconductor;
      a second electrode over the second oxide semiconductor, the second electrode being electrically connected to the second oxide semiconductor and the first oxide semiconductor;
      a second charge trap layer over the second oxide semiconductor and the second electrode; and
      a second gate electrode over the second charge trap layer, the second gate electrode overlapping the second oxide semiconductor and being electrically connected to the second electrode,
   wherein the first transistor further comprises a third oxide semiconductor over the first electrode,
   wherein the third oxide semiconductor is in contact with a top surface of the first oxide semiconductor and a side surface of the first oxide semiconductor,
   wherein the second transistor further comprises a fourth oxide semiconductor over the second electrode,
   wherein the fourth oxide semiconductor is in contact with a top surface of the second oxide semiconductor and a side surface of the second oxide semiconductor, and
   wherein the number of electrons held in the first charge trap layer is larger than the number of electrons held in the second charge trap layer.

2. The semiconductor device according to claim 1, wherein the first charge trap layer and the second charge trap layer each contain any one of hafnium oxide, aluminum oxide, and aluminum silicate.

3. The semiconductor device according to claim 1, wherein the first electrode is a source electrode or a drain electrode.

4. The semiconductor device according to claim 1, further comprising a fifth oxide semiconductor under the first oxide semiconductor.

5. The semiconductor device according to claim 1,
   wherein the first charge trap layer includes a first insulating layer, a second insulating layer over the first insulating layer, and a third insulating layer over the second insulating layer, and wherein the second insulating layer contains any one of hafnium oxide, aluminum oxide, and aluminum silicate.

6. The semiconductor device according to claim 1, wherein the first transistor is an enhancement-mode transistor.

7. The semiconductor device according to claim 1, wherein the second transistor is a depletion-mode transistor.

8. An electronic device comprising:
the semiconductor device according to claim 1; and
a display device.

9. An electronic device comprising:
the semiconductor device according to claim 1; and
a battery.

10. The semiconductor device according to claim 1, wherein the second gate electrode is in contact with the second electrode.

11. A semiconductor device comprising:
a first transistor;
a second transistor;
a planarization film over the first transistor and the second transistor; and
a wiring over the planarization film,
wherein the first transistor comprises:
  a first oxide semiconductor;
  a first electrode over the first oxide semiconductor, the first electrode being electrically connected to the first oxide semiconductor;
  a first charge trap layer over the first oxide semiconductor and the first electrode; and
  a first gate electrode over the first charge trap layer, the first gate electrode overlapping the first oxide semiconductor,
wherein the second transistor comprises:
  a second oxide semiconductor;
  a second electrode over the second oxide semiconductor, the second electrode being electrically connected to the second oxide semiconductor and the first oxide semiconductor;
  a second charge trap layer over the second oxide semiconductor and the second electrode; and
  a second gate electrode over the second charge trap layer, the second gate electrode overlapping the second oxide semiconductor and being electrically connected to the second electrode via the wiring,
wherein the first transistor further comprises a third oxide semiconductor over the first electrode,
wherein the third oxide semiconductor is in contact with a top surface of the first oxide semiconductor and a side surface of the first oxide semiconductor,
wherein the second transistor further comprises a fourth oxide semiconductor over the second electrode,
wherein the fourth oxide semiconductor is in contact with a top surface of the second oxide semiconductor and a side surface of the second oxide semiconductor, and
wherein the number of electrons held in the first charge trap layer is larger than the number of electrons held in the second charge trap layer.

12. The semiconductor device according to claim 11, wherein the first charge trap layer and the second charge trap layer each contain any one of hafnium oxide, aluminum oxide, and aluminum silicate.

13. The semiconductor device according to claim 11, wherein the first electrode is a source electrode or a drain electrode.

14. The semiconductor device according to claim 11, further comprising a fifth oxide semiconductor under the first oxide semiconductor.

15. The semiconductor device according to claim 11,
wherein the first charge trap layer includes a first insulating layer, a second insulating layer over the first insulating layer, and a third insulating layer over the second insulating layer, and
wherein the second insulating layer contains any one of hafnium oxide, aluminum oxide, and aluminum silicate.

16. The semiconductor device according to claim 11, wherein the first transistor is an enhancement-mode transistor.

17. The semiconductor device according to claim 11, wherein the second transistor is a depletion-mode transistor.

18. An electronic device comprising:
the semiconductor device according to claim 11; and
a display device.

19. An electronic device comprising:
the semiconductor device according to claim 11; and
a battery.

* * * * *